United States Patent
Nakano et al.

(10) Patent No.: US 9,341,903 B2
(45) Date of Patent: May 17, 2016

(54) ACTIVE MATRIX SUBSTRATE AND LIQUID CRYSTAL DISPLAY PANEL INCLUDING THE SAME

(71) Applicant: Sharp Kabushiki Kaisha, Osaka-shi, Osaka (JP)

(72) Inventors: Fumiki Nakano, Osaka (JP); Tadayoshi Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 165 days.

(21) Appl. No.: 14/367,965

(22) PCT Filed: Dec. 19, 2012

(86) PCT No.: PCT/JP2012/008104
§ 371 (c)(1),
(2) Date: Jun. 23, 2014

(87) PCT Pub. No.: WO2013/099155
PCT Pub. Date: Jul. 4, 2013

(65) Prior Publication Data
US 2014/0362323 A1    Dec. 11, 2014

(30) Foreign Application Priority Data
Dec. 26, 2011    (JP) .................. 2011-283103

(51) Int. Cl.
| | | |
|---|---|---|
| *G02F 1/1362* | (2006.01) | |
| *G02F 1/1343* | (2006.01) | |
| *G02F 1/1368* | (2006.01) | |
| *H01L 27/12* | (2006.01) | |

(52) U.S. Cl.
CPC ........ *G02F 1/136286* (2013.01); *G02F 1/1368* (2013.01); *G02F 1/136213* (2013.01); *H01L27/124* (2013.01); *H01L 27/1255* (2013.01); *G02F 1/13624* (2013.01); *G02F 2001/13685* (2013.01)

(58) Field of Classification Search
CPC ............ H01L 27/1214; H01L 27/3262; H01L 27/1251; H01L 27/3248; H01L 27/3265; H01L 27/3276; H01L 29/786; G02F 1/136286; G02F 1/1368; G02F 1/134309; G02F 1/136213; G02F 1/133345; G02F 1/13624; G02F 1/134336; G02F 1/136227; G02F 1/13306; G02F 1/1343; G02F 1/133514; G02F 1/1362; G02F 1/141; G02F 2001/134345; G02F 2001/13685; G09G 2300/0426; G09G 2300/0443; G09G 2300/0452; G09G 2300/0809; G09G 2300/0876; G09G 3/3614; G09G 3/3648; G09G 3/3688; G09G 3/3677; G09G 3/36; G09G 2310/0262
USPC ........ 257/59, 72, 71; 345/87, 690, 88, 89, 96, 345/92; 349/43, 144, 33, 46, 39, 42, 138, 349/139, 106, 143, 47, 48, 38, 37
See application file for complete search history.

(56) References Cited

U.S. PATENT DOCUMENTS

| | | | |
|---|---|---|---|
| 2008/0018816 A1 | 1/2008 | Hattori et al. | |
| 2011/0043498 A1* | 2/2011 | Tsubata ............ | G02F 1/13624 345/204 |

FOREIGN PATENT DOCUMENTS

| | | |
|---|---|---|
| JP | 2008-026430 A | 2/2008 |
| JP | 2010-020171 A | 1/2010 |

OTHER PUBLICATIONS

Official Communication issued in International Patent Application No. PCT/JP2012/008104, mailed on Mar. 26, 2013.

*Primary Examiner* — Thoi Duong
(74) *Attorney, Agent, or Firm* — Keating & Bennett, LLP

(57) ABSTRACT

An auxiliary capacitor (6) of each of sub-pixels (P) includes a transparent electrode, a pixel electrode, and a capacitor insulating film between the transparent electrode and the pixel electrode. Switching elements (5a) are connected, for every predetermined sub-pixel(s) (P) along a column direction of the sub-pixels (P) arranged in rows and columns, to the source lines (15a) different from each other. A plurality of transparent electrodes are each shared by a pair of the sub-pixels (P) which are adjacent to each other in a predetermined direction and are arranged in a corresponding one of the wide spaces each provided between adjacent two of gate lines (13). The transparent electrodes adjacent to each other in the row direction receive different signals.

20 Claims, 18 Drawing Sheets

US 9,341,903 B2

ACTIVE MATRIX SUBSTRATE AND LIQUID CRYSTAL DISPLAY PANEL INCLUDING THE SAME

TECHNICAL FIELD

The present invention relates to active matrix substrates and liquid crystal display panels including the same, and specifically to a technique for reducing degradation in image quality and for reducing panel driving power of an active matrix drive type liquid crystal display panel.

BACKGROUND ART

An active matrix drive type liquid crystal display panel includes, for example, an active matrix substrate having sub-pixels each being a minimum unit of an image and including a switching element, a pixel electrode connected to the switching element, and others, a counter substrate facing the active matrix substrate, and a liquid crystal layer between the active matrix substrate and the counter substrate. Here, in many active matrix substrates, an auxiliary capacitor is provided in each sub-pixel in order to stably retain charge of the liquid crystal layer in each sub-pixel, namely a liquid crystal capacitor in each sub-pixel. In the active matrix drive type liquid crystal display panel, there are constant demands for increasing the aperture ratio of each sub-pixel to reduce electric power consumption by a backlight and for reducing electric power required to drive the liquid crystal display panel.

For example, Patent Document 1 describes a liquid crystal display device (corresponding to the liquid crystal display panel) including a storage capacitor (corresponding to the auxiliary capacitor) having transparent electrodes on a transparent substrate, a coating type transparent insulating film covering the transparent electrodes and having a dielectric constant greater than or equal to 4.0, and pixel electrodes on the coating type transparent insulating film in order to increase the aperture ratio.

The active matrix substrate in which an auxiliary capacitor is provided in each sub-pixel includes a plurality of gate lines extending parallel to each other, a plurality of capacitor lines each extending between adjacent two of the gate lines, and a plurality of source lines extending parallel to each other in a direction orthogonal to the gate lines. Each of the switching elements is provided, for example, at a corresponding one of intersections of the gate lines and the source lines. In the active matrix drive type liquid crystal display panel, a technique has been proposed where the switching elements are arranged in a staggered pattern along the gate lines and the source lines so that the polarity of a signal input to each source line is inverted for every line, and not only the gate lines but also the capacitor lines are sequentially scanned and driven, thereby reducing degradation in image quality and reducing panel driving power.

For example, Patent Document 2 describes a liquid crystal display device in which switching means (corresponding to the switching elements) of display pixels (corresponding to the sub-pixels) adjacent to each other in a direction in which signal lines (corresponding to the source lines) extend are connected to the signal lines different from each other in order to reduce panel driving power and to reduce degradation in image quality.

CITATION LIST

Patent Document

PATENT DOCUMENT 1: Japanese Unexamined Patent Publication No. 2008-26430

PATENT DOCUMENT 2: Japanese Unexamined Patent Publication No. 2010-20171 (FIG. 2)

SUMMARY OF THE INVENTION

Technical Problem

However, in the liquid crystal display device described in Patent Document 2, a light shielding gate line is provided to cross a center section of each sub-pixel. Therefore, the aperture ratio of each sub-pixel is still susceptible to improvement. Specifically, each sub-pixel requires a total of two signal lines, i.e., one gate line, 0.5 positive polarity capacitor line, and 0.5 negative polarity capacitor line such that the signal lines extend in a lateral direction in FIG. 2 of Patent Document 2. Thus, the entire panel requires capacitor lines the number of which is equal to the number of the gate lines. Therefore, the aperture ratio is still susceptible to improvement.

In view of the above-described problems, it is an object of the present invention to provide a technique for improving the aperture ratio of each sub-pixel, reducing degradation in image quality, and reducing panel driving power.

Solution to the Problem

To achieve the object, the present invention has a configuration in which an auxiliary capacitor of each of sub-pixels includes a transparent electrode, a pixel electrode, and a capacitor insulating film provided between the transparent electrode and the pixel electrode, switching elements are connected, for every predetermined sub-pixel(s) along a column direction of the sub-pixels arranged in rows and columns, to the source lines different from each other, and a plurality of transparent electrodes are each shared by a pair of sub-pixels which are adjacent to each other in a predetermined direction and are arranged in a corresponding one of wide spaces each provided between adjacent two of the gate lines, wherein the transparent electrodes adjacent to each other in a row direction receive different signals.

Specifically, an active matrix substrate according to the present invention includes: a plurality of sub-pixels arranged in rows and columns; a plurality of gate lines each two of which are arranged in every other space extending in a row direction between the sub-pixels such that the gate lines extend parallel to each other with narrow spaces and wide spaces being alternately provided therebetween; a plurality of source lines each of which is provided in a corresponding one of spaces extending in a column direction between the sub-pixels such that the source lines extend parallel to each other; a plurality of switching elements each of which is provided at a corresponding one of intersections of the gate lines and the source lines, and which are connected, for each pair of the sub-pixels, to the source lines different from each other, the sub-pixels in the pair being adjacent to each other in the column direction and being arranged in a corresponding one of the wide spaces each provided between adjacent two of the gate lines along the column direction; a protective insulating film covering the switching elements, a plurality of transparent electrodes provided on the protective insulating film such that each transparent electrode is shared by a pair of the sub-pixels which are adjacent to each other in the column direction and are arranged in a corresponding one of the wide spaces each provided between adjacent two of the gate lines, wherein the transparent electrodes adjacent to each other in the row direction receive different signals; a capacitor insulating film covering the transparent electrodes, and a plurality of pixel electrodes arranged in rows and columns on the capacitor insulating film and each connected to a corresponding one of the switching elements.

In this configuration, the auxiliary capacitor of each sub-pixel includes the transparent electrode, the pixel electrode, and the capacitor insulating film provided between the transparent electrode and the pixel electrode. Therefore, most portions of a region which each sub-pixel has and is included in the auxiliary capacitor have a light transmitting property. Thus, even if the area of each sub-pixel occupied by the auxiliary capacitor increases, the aperture ratio is not lowered, so that the aperture ratio of each sub-pixel is improved.

The switching elements are connected, for each pair of the sub-pixels, to the source lines different from each other, the sub-pixels in the pair being adjacent to each other in the column direction and being arranged in a corresponding one of the wide spaces each provided between adjacent two of the gate lines along the column direction of the sub-pixels arranged in rows and columns. Therefore, even if polarity inversion of signals input to the source lines is not performed every two horizontal periods, display on the liquid crystal display panel is similar to that in the case where polarity inversion of signals input to source lines is performed every two horizontal periods in a liquid crystal display panel having a common structure. Thus, it is possible to reduce degradation in image quality.

Moreover, when a liquid crystal display panel including the active matrix substrate having the above-described configuration is driven, it is not necessary to perform polarity inversion every one horizontal period, so that the amount of voltage change of each source line within one vertical period is reduced. This reduces electric power required to charge/discharge the source lines, so that it is possible to reduce the driving power of the liquid crystal display panel, and degradation in image quality due to insufficient charging of the pixel electrodes is reduced. The plurality of transparent electrodes are each shared by a pair of the sub-pixels which are adjacent to each other in the column direction and are provided in a corresponding one of the wide spaces each provided between adjacent two of the gate lines, wherein the transparent electrodes adjacent to each other in the row direction receive different signals. Therefore, when the liquid crystal display panel including the active matrix substrate is driven, not only the gate lines but also the transparent electrodes are sequentially scanned along the column direction and driven, so that it is possible to further reduce the amplitude of a voltage applied to each source line, and further reduce the driving power of the liquid crystal display panel.

Therefore, it is possible to improve the aperture ratio of each sub-pixel, reduce degradation in image quality, and reduce the panel driving power.

Another active matrix substrate according to the present invention includes: a plurality of sub-pixels arranged in rows and columns; a plurality of gate lines each two of which are arranged in every other space extending in a row direction between the sub-pixels such that the gate lines extend parallel to each other with narrow spaces and wide spaces being alternately provided therebetween; a plurality of source lines each of which is provided in a corresponding one of spaces extending in a column direction between the sub-pixels such that the source lines extend parallel to each other; a plurality of switching elements each of which is provided at a corresponding one of intersections of the gate lines and the source lines, and which are connected, for each sub-pixel along the column direction, to the source lines different from each other; a protective insulating film covering the switching elements; a plurality of transparent electrodes provided on the protective insulating film such that each transparent electrode is shared by a pair of the sub-pixels which are adjacent to each other in a diagonal direction of the sub-pixels and are arranged in a corresponding one of the wide spaces each provided between adjacent two of the gate lines, wherein the transparent electrodes adjacent to each other in the row direction receive different signals; a capacitor insulating film covering the transparent electrodes; and a plurality of pixel electrodes arranged in rows and columns on the capacitor insulating film and each connected to a corresponding one of the switching elements.

In this configuration, the auxiliary capacitor of each sub-pixel includes the transparent electrode, the pixel electrode, and the capacitor insulating film provided between the transparent electrode and the pixel electrode. Therefore, most portions of a region which each sub-pixel has and is included in the auxiliary capacitor have a light transmitting property. Thus, even if the area of each sub-pixel occupied by the auxiliary capacitor increases, the aperture ratio is not lowered, so that the aperture ratio of each sub-pixel is improved.

The switching elements are connected, for each sub-pixel along the column direction of the sub-pixels arranged in rows and columns, to the source lines different from each other. Therefore, even if polarity inversion of signals input to the source lines is not performed every one horizontal period, display on the liquid crystal display panel is similar to that in the case where polarity inversion of signals input to source lines is performed every one horizontal period in a liquid crystal display panel having a common structure. Thus, it is possible to reduce degradation in image quality.

Moreover, when a liquid crystal display panel including the active matrix substrate having the above-described configuration is driven, it is not necessary to perform polarity inversion every one horizontal period, so that the amount of voltage change of each source line within one vertical period is reduced. This reduces electric power required to charge/discharge the source lines, so that it is possible to reduce the driving power of the liquid crystal display panel, and degradation in image quality due to insufficient charging of the pixel electrodes is reduced. The plurality of transparent electrodes are each shared by a pair of the sub-pixels which are adjacent to each other in a diagonal direction and are provided in a corresponding one of the wide spaces each provided between adjacent two of the gate lines, wherein the transparent electrodes adjacent to each other in the row direction receive different signals. Therefore, when the liquid crystal display panel including the active matrix substrate is driven, not only the gate lines but also the transparent electrodes are sequentially scanned along the column direction and driven, so that it is possible to further reduce the amplitude of a voltage applied to each source line, and further reduce the driving power of the liquid crystal display panel.

Therefore, it is possible to improve the aperture ratio of each sub-pixel, reduce degradation in image quality, and reduce the panel driving power.

Here, in the active matrix substrate having the above-described configuration, polarity inversion of the liquid crystal capacitors and the auxiliary capacitors is possible for every sub-pixel along the column direction, so that display with higher quality is possible.

Capacitor lines may be each provided in corresponding one of the narrow spaces each provided between adjacent two of the gate lines, wherein the transparent electrodes, each of which is shared by the pair of sub-pixels and which are adjacent to each other in the row direction, may be connected the capacitor lines different from each other.

According to the above configuration, each capacitor line is provided in a corresponding one of the narrow spaces each provided between adjacent two of the gate lines, and the transparent electrodes, each of which is shared by a pair of sub-pixels and which are adjacent to each other in the row direction, are connected to the capacitor lines different from each other. Therefore, the transparent electrodes are sequentially scanned along the column direction by sequentially scanning the capacitor lines. Here, the quantity of capacitor lines is (the quantity of gate lines)×½+1, for example, about ½ of the quantity of capacitor lines of the liquid crystal display device described in Patent Document 2 in which each capacitor line is provided in a corresponding one of spaces each provided between adjacent two of the gate lines. Therefore, even if a light shielding capacitor line is provided, the aperture ratio of each sub-pixel is improved.

Each capacitor line may be in contact with corresponding ones of the transparent electrodes.

According to the above configuration, each capacitor line is in contact with a corresponding one of the transparent electrodes. Thus, each capacitor line is connected to corresponding ones of the transparent electrodes without forming a contact hole. For example, a metal interconnect having a lower electrical resistance than the transparent electrode is used as the capacitor line, so that a signal delay in each transparent electrode is reduced.

The capacitor lines may be fewer than the gate lines.

According to the above configuration, the capacitor lines are fewer than the gate lines, so that the aperture ratio of each sub-pixel is improved.

The quantity y of the capacitor lines may be x/2+1, where x represents a quantity of the gate lines, and is an even number.

According to the above configuration, the quantity of the capacitor lines is substantially ½ of the number of gate lines, so that the aperture ratio of each sub-pixel is improved.

The quantity y of the capacitor lines may be x/2+1.5, where x represents a quantity of the gate lines, and is an odd number.

According to the above configuration, the quantity of capacitor lines is substantially ½ of the number of gate lines, so that the aperture ratio of each sub-pixel is improved.

Each switching element may be a thin film transistor.

According to the above configuration, an active matrix substrate in which a thin film transistor is included in each of the sub-pixels is specifically provided.

The thin film transistor may have a top gate structure.

According to the above configuration, an active matrix substrate in which a thin film transistor having a top gate structure is included in each of the sub-pixels is provided.

The thin film transistor may have a bottom gate structure.

According to the above configuration, an active matrix substrate in which a thin film transistor having a bottom gate structure is included in each of the sub-pixels is provided.

A liquid crystal display panel according to the present invention includes: any one of the active matrix substrates described above; a counter substrate facing the active matrix substrate; and a liquid crystal layer between the active matrix substrate and the counter substrate.

According to the above configuration, in the active matrix substrate, the auxiliary capacitor of each sub-pixel includes the transparent electrode, the pixel electrode, and the capacitor insulating film provided between the transparent electrode and the pixel electrode, the switching elements are connected, for every predetermined sub-pixel(s) along the column direction of the sub-pixels arranged in rows and columns, to the source lines different from each other, and the plurality of transparent electrodes are each shared by a pair of sub-pixels which are adjacent to each other in a predetermined direction and are arranged in a corresponding one of the wide spaces each provided between adjacent two of the gate lines, wherein the transparent electrodes adjacent to each other in the row direction receive different signals. Thus, in the liquid crystal display panel including the active matrix substrate, it is possible to improve the aperture ratio of each sub-pixel, reduce degradation in image quality, and reduce the panel driving power.

The liquid crystal display panel may be configured such that signals input to the source lines have different polarities for every other line, and the polarities are unchanged within one vertical period.

According to the above configuration, signals input to the source lines have different polarities for every other line. Thus, even if polarity inversion of signals input to the source lines is not performed every two (or one) horizontal periods, display on the liquid crystal display panel is similar to that in the case where polarity inversion of signals input to source lines is performed every two (or one) horizontal periods in a liquid crystal display panel having a common structure, so that degradation in image quality can be reduced. According to the above configuration, the polarities of signals input to the source lines are also unchanged within one vertical period, and thus electric power required to charge/discharge the source lines is reduced. Thus, the driving power of the liquid crystal display panel can be reduced, and degradation in image quality due to insufficient charging of the pixel electrodes is reduced.

Each capacitor may receive a voltage having a high electric potential or a voltage having a low electric potential with a reception timing being shifted by two horizontal periods sequentially in an order of arrangement of the capacitor lines such that the capacitor lines receiving the voltage having the high electric potential and the capacitor lines receiving the voltage having the low electric potential are alternately arranged.

According to the above configuration, each capacitor receives a voltage having a high electric potential or a voltage having a low electric potential with a reception timing being shifted by two horizontal periods sequentially in an order of arrangement of the capacitor lines such that the capacitor lines receiving the voltage having the high electric potential and the capacitor lines receiving the voltage having the low electric potential are alternately arranged. Thus, the auxiliary capacitor of each sub-pixel effectively functions based on the polarity of a voltage applied to the pixel electrode of each sub-pixel via the source line, so that the amplitude of a voltage applied to each source line can be reduced, and the driving power of the liquid crystal display panel can be reduced.

Advantages of the Invention

According to the present invention, the auxiliary capacitor of each sub-pixel includes the transparent electrode, the pixel electrode, and the capacitor insulating film provided between the transparent electrode and the pixel electrode, the switching elements are connected, for every predetermined sub-pixel(s) along the column direction of the sub-pixels arranged in rows and columns, to the source lines different from each other, and the plurality of transparent electrodes are each shared by a pair of sub-pixels which are adjacent to each other in a predetermined direction and are arranged in a corresponding one of the wide spaces each provided between adjacent two of the gate lines, wherein the transparent electrodes adjacent to each other in the row direction receive different signals. Thus, it is possible to improve the aperture ratio of each sub-pixel, reduce degradation in image quality, and reduce the panel driving power.

DESCRIPTION OF EMBODIMENTS

Embodiments of the present disclosure will be described in detail below based on the drawings. The present invention is not limited to the following embodiments.

First Embodiment of the Invention

Figure 1:
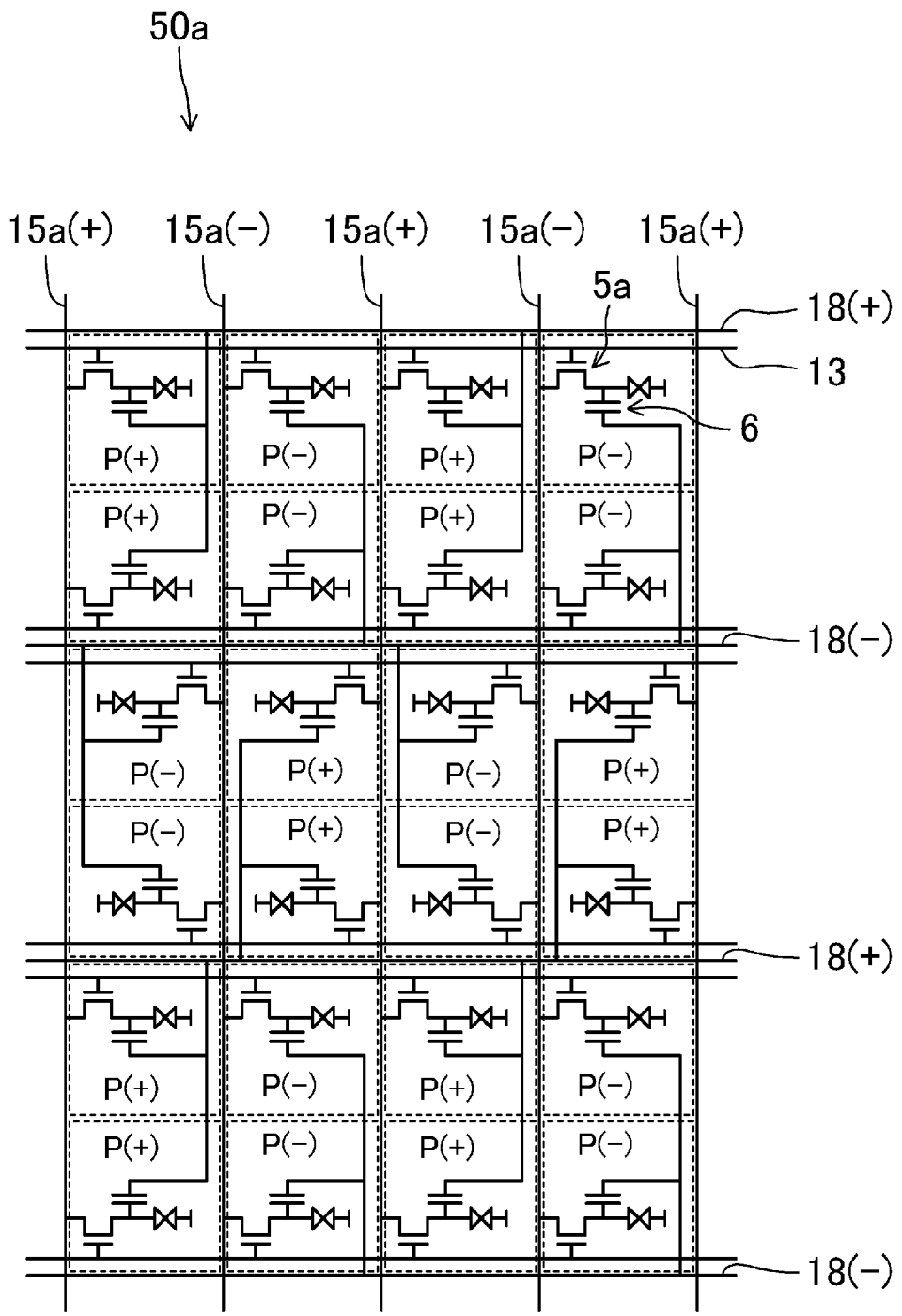
FIG. 1 is an equivalent circuit diagram illustrating a liquid crystal display panel according to a first embodiment.
Figure 2:
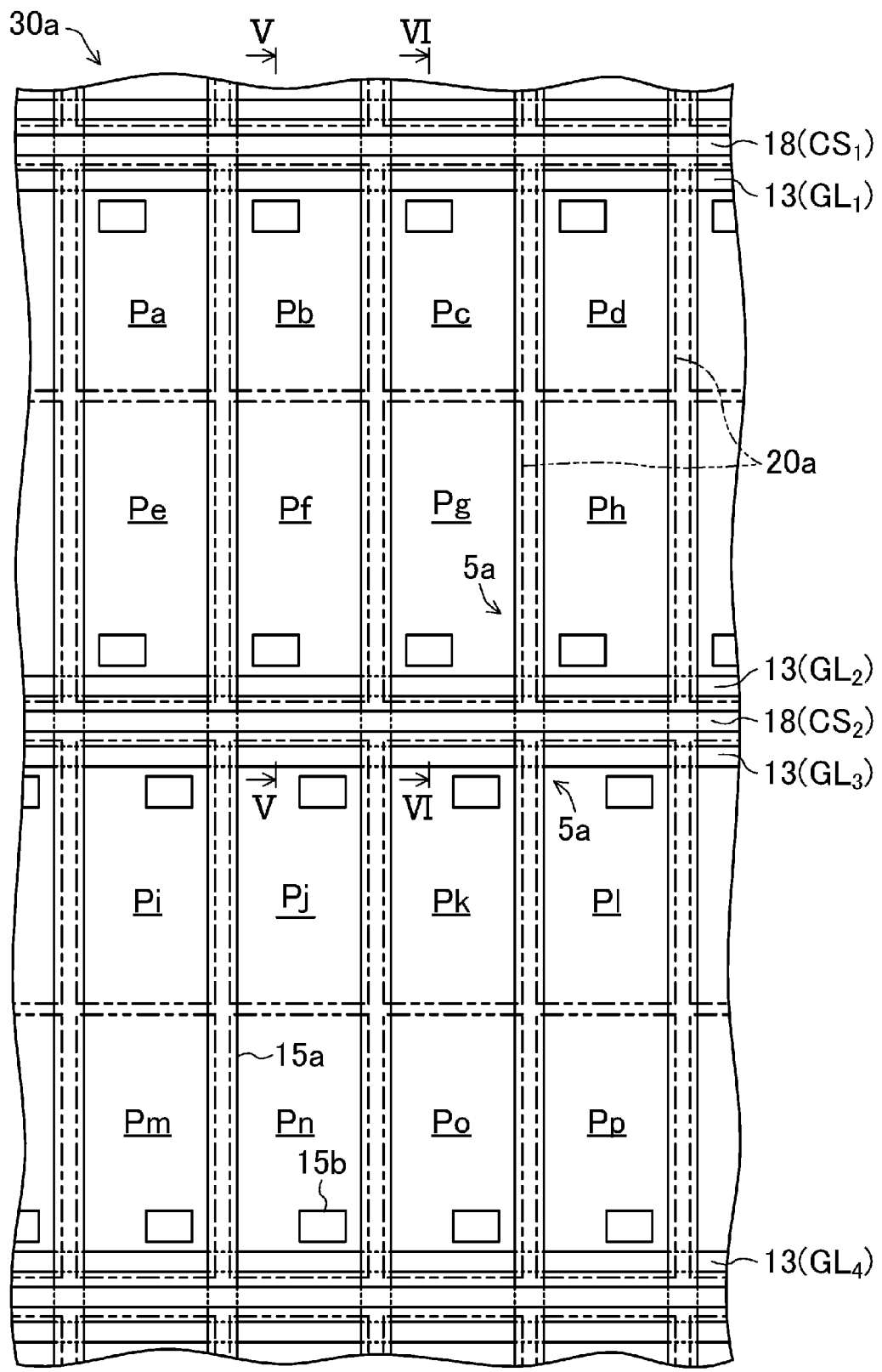
FIG. 2 is a plan view illustrating an active matrix substrate included in the liquid crystal display panel according to the first embodiment.
Figure 3:
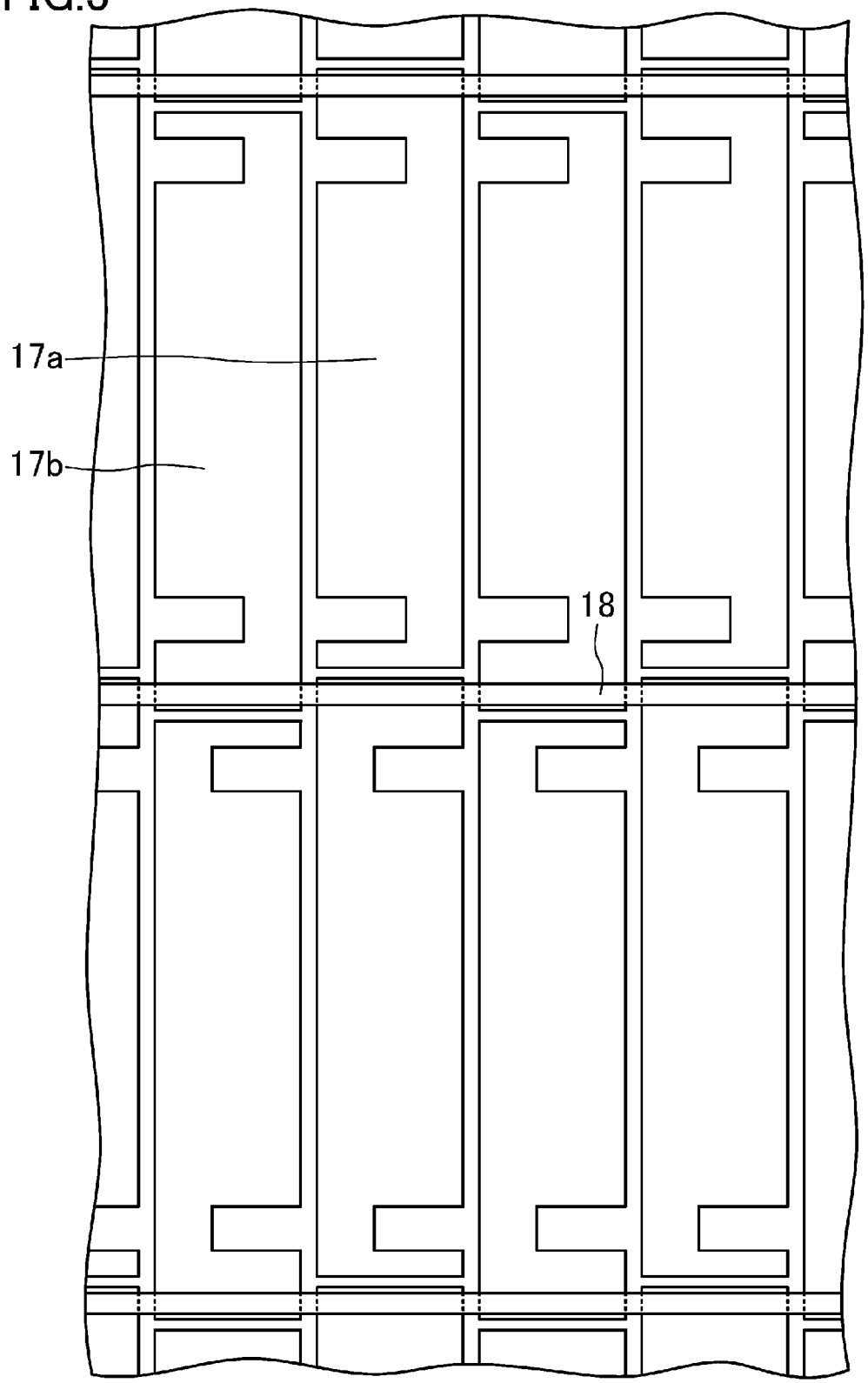
FIG. 3 is a plan view illustrating transparent electrodes and capacitor lines included in the active matrix substrate according to the first embodiment.
Figure 4:
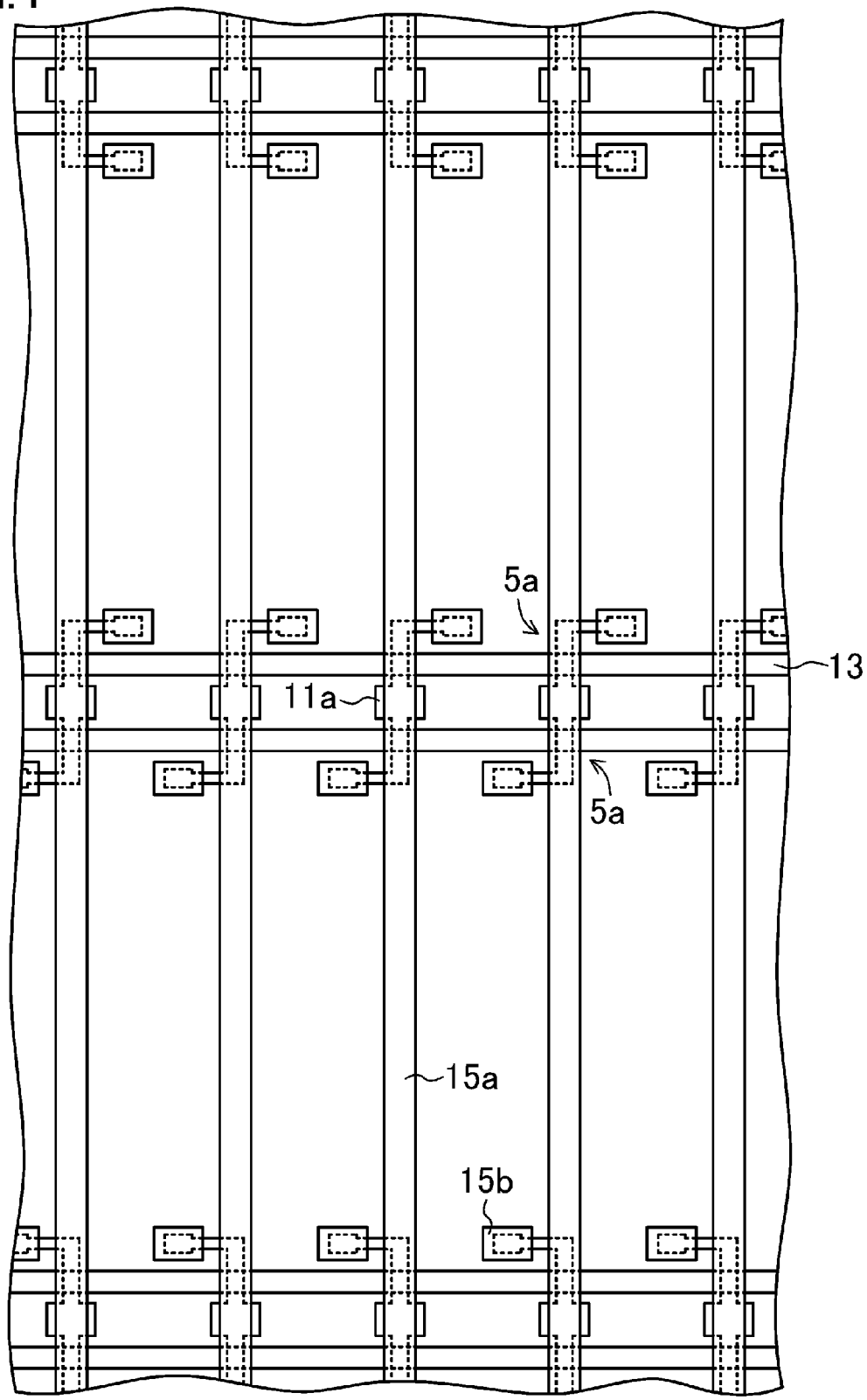
FIG. 4 is a plan view illustrating a semiconductor layer, a gate layer, and a source layer included in the active matrix substrate according to the first embodiment.
Figure 5:
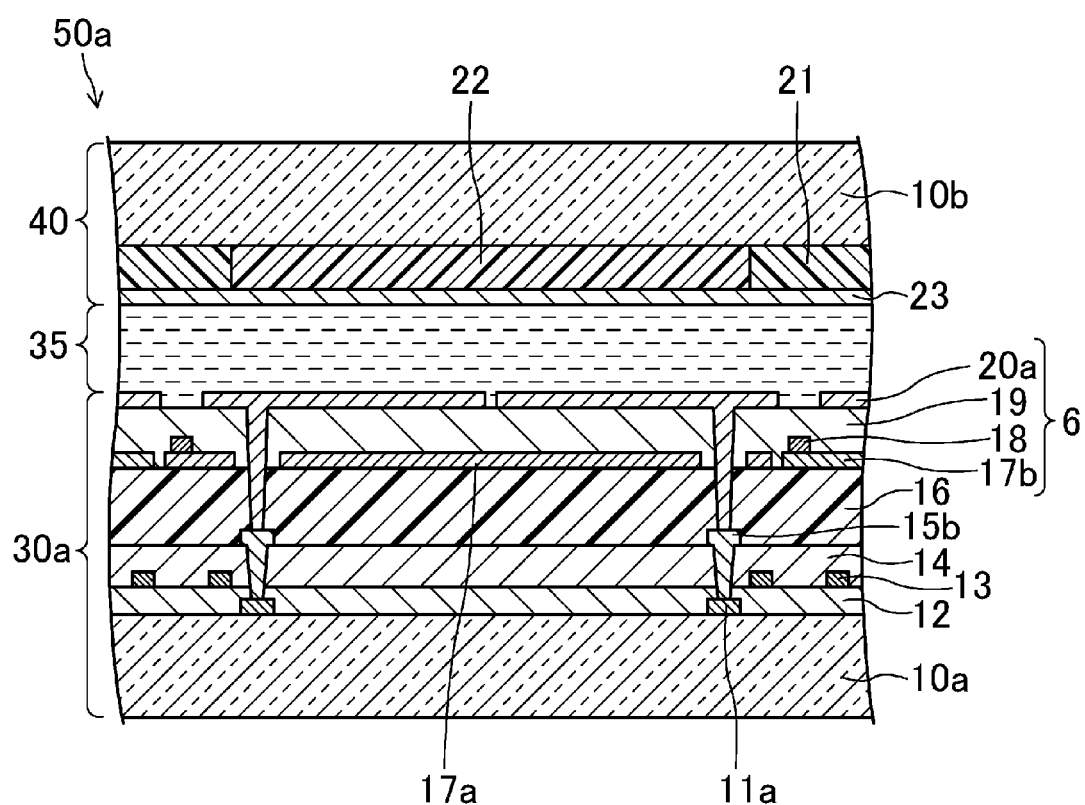
FIG. 5 is a cross-sectional view illustrating the active matrix substrate and the liquid crystal display panel including the same taken along the line V-V of FIG. 2.
Figure 6:
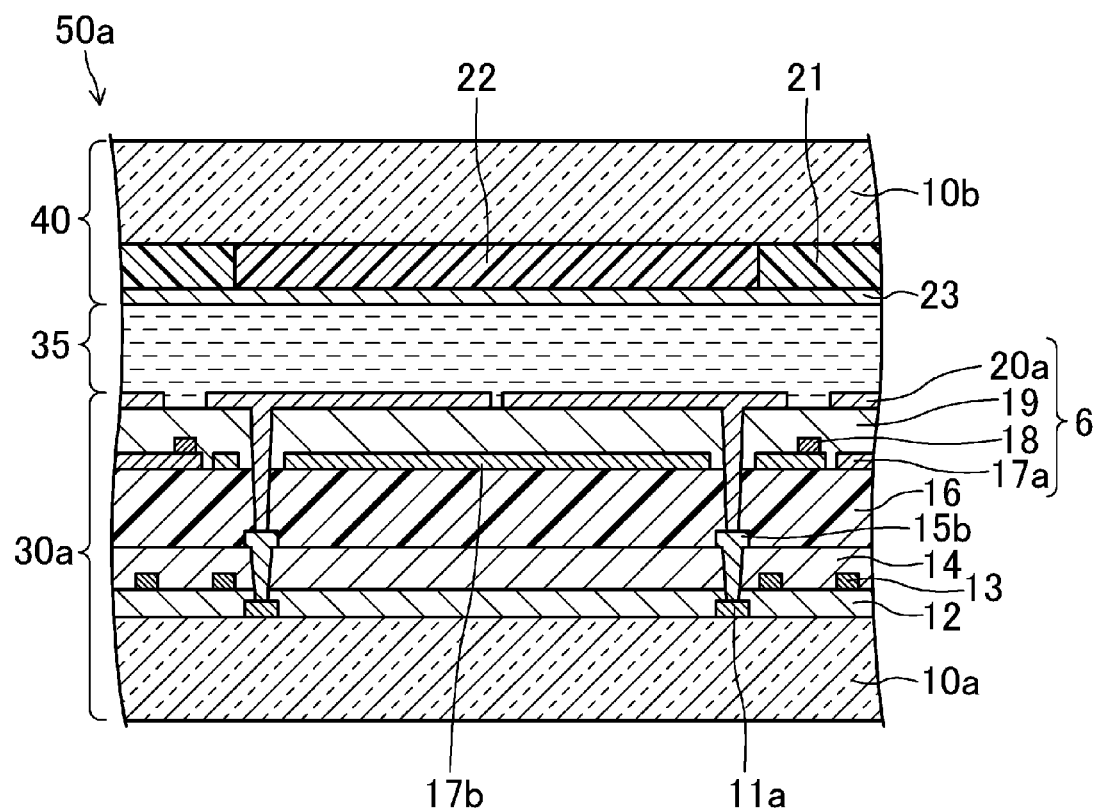
FIG. 6 is a cross-sectional view illustrating the active matrix substrate and the liquid crystal display panel including the same taken along the line VI-VI of FIG. 2.

FIGS. 1-7 illustrate a first embodiment of an active matrix substrate according to the present invention and a liquid crystal display panel including the same. Specifically, FIG. 1 is an equivalent circuit diagram illustrating a liquid crystal display panel 50a of the present embodiment. FIG. 2 is a plan view illustrating an active matrix substrate 30a included in the liquid crystal display panel 50a. FIG. 3 is a plan view illustrating transparent electrodes 17a and 17b and capacitor lines 18 included in the active matrix substrate 30a of FIG. 2. FIG. 4 is a plan view illustrating a semiconductor layer 11a, a gate layer such as gate lines 13, and a source layer such as source lines 15a, included in the active matrix substrate 30a of FIG. 2. FIGS. 5 and 6 are cross-sectional views illustrating the active matrix substrate 30a and the liquid crystal display panel 50a including the same respectively taken along the line V-V and the line VI-VI of FIG. 2. In FIG. 2, pixel electrodes 20a located in an uppermost layer are indicated by a dash-double dotted line.

As illustrated in FIGS. 5 and 6, the liquid crystal display panel 50a includes the active matrix substrate 30a and a counter substrate 40 facing each other, a liquid crystal layer 35 provided between the active matrix substrate 30a and the counter substrate 40, and a frame-like sealing material (not shown) for bonding the active matrix substrate 30a and the counter substrate 40 to each other and for sealing the liquid crystal layer 35 between the active matrix substrate 30a and the counter substrate 40. Here, a display region for displaying an image is defined in a region of the liquid crystal display panel 50a surrounded by the sealing material, and in the display region, a plurality of pixels are arranged in rows and columns. In each pixel, as illustrated in FIG. 1, for example, sub-pixels P for displaying gradation of a red color, sub-pixels P for displaying gradation of a green color, and sub-pixels P for displaying gradation of a blue color are arranged, so that in the liquid crystal display panel 50a, the plurality of sub-pixels P are provided in rows and columns. The liquid crystal display panel 50a forms a liquid crystal display device together with, for example, a backlight (not shown) provided at a back side of the liquid crystal display panel 50a.

As illustrated in FIGS. 1-6, the active matrix substrate 30a includes transparent substrate 10a, the plurality of gate lines 13 each two of which are arranged in every other space extending in a row direction (a lateral direction in FIGS. 1-4) between the plurality of sub-pixels P on the transparent substrate 10a such that the gate lines 13 extend parallel to each other with narrow spaces and wide spaces being alternately provided therebetween, the plurality of source lines 15a each of which is arranged in a corresponding one of spaces extending in a column direction (a longitudinal direction in FIGS. 1-4) between the sub-pixels P such that the source lines 15a extend parallel to each other, a plurality of TFTs 5a each provided as a switching element at a corresponding one of intersections of the gate lines 13 and the source lines 15a, a protective insulating film 16 covering the TFTs 5a, a plurality of transparent electrodes 17a and 17b provided in rows and columns on the protective insulating film 16, a capacitor insulating film 19 covering the transparent electrodes 17a and 17b, the plurality of pixel electrodes 20a provided in rows and columns on the capacitor insulating film 19, and each connected to a corresponding one of the TFTs 5a, and an alignment layer (not shown) covering the pixel electrodes 20a. Here, in the active matrix substrate 30a, as illustrated in FIGS. 1-6, an auxiliary capacitor 6 of each sub-pixel P includes the transparent electrode 17a or 17b, the pixel electrode 20a, and the capacitor insulating film 19 between the transparent electrode 17a or 17b and the pixel electrode 20a.

As illustrated in FIGS. 1-6, each TFT 5a includes the semiconductor layer 11a provided on the transparent substrate 10a via the base coat film (not shown), and having a source region, a drain region, and a channel region, a gate insulating film 12 covering the semiconductor layer 11a, a gate electrode (13) provided on the gate insulating film 12 to overlap the channel region of the semiconductor layer 11a, an interlayer insulating film 14 covering the gate electrode (13), and a source electrode (15a) and a drain electrode 15b provided on the interlayer insulating film 14 and being apart from each other. Here, in the active matrix substrate 30a, as illustrated in FIGS. 1 and 4, the TFTs 5a are connected, for each pair of the sub-pixels, to the source lines 15a different from each other, the sub-pixels P in the pair being adjacent to each other in the column direction and being arranged in a corresponding one of the wide spaces each provided between adjacent two of the gate lines 13 along the column direction.

As illustrated in FIG. 4, each gate electrode (13) is part of the gate line 13.

As illustrated in FIG. 4, each source electrode (15a) is part of the source line 15a. Each source electrode (15a) is connected to the source region of the semiconductor layer 11a via a contact hole (not shown) formed in the gate insulating film 12 and the interlayer insulating film 14.

Each drain electrode 15b is connected to the drain region of the semiconductor layer 11a via a contact hole formed in the gate insulating film 12 and in the interlayer insulating film 14. As illustrated in FIGS. 5 and 6, each drain electrode 15b is connected to the pixel electrode 20a via a contact hole formed in the protective insulating film 16 and the capacitor insulating film 19.

As illustrated in FIG. 3, each of the transparent electrodes 17a and 17b is shared by a pair of the sub-pixels P which are adjacent to each other in the column direction and are arranged in a corresponding one of the wide spaces each provided between adjacent two of the gate lines 13. As illustrated in FIG. 3, the transparent electrodes 17a and 17b are connected the capacitor lines 18 different from each other such that the transparent electrodes 17a and 17b adjacent to each other in the row direction receive different signals. Here, as illustrated in FIGS. 1-6, on the transparent electrodes 17a and 17b, each capacitor line 18 is provided in a corresponding one of the narrow spaces each provided between adjacent two of the gate lines 13.

As illustrated in FIGS. 5 and 6, the counter substrate 40 includes a transparent substrate 10b, a black matrix 21 provided on the transparent substrate 10b and having the shape of a frame and a lattice pattern in the frame, a plurality of colored layers 22 such as a red layer, a green layer, and a blue layer provided in the squares of the lattice of the black matrix 21, a common electrode 23 covering the black matrix 21 and the colored layers 22, and an alignment layer (not shown) covering the common electrode 23.

The liquid crystal layer 35 is made of, for example, a nematic liquid crystal material having electro-optic characteristics.

In the liquid crystal display panel 50a having the above-described configuration, a predetermined voltage for each sub-pixel P is applied to the liquid crystal layer 35 provided between each pixel electrode 20a on the active matrix substrate 30a and the common electrode 23 on the counter substrate 40 to change the alignment of the liquid crystal layer 35 so that the transmittance of light transmitted in the panel is adjusted in each sub-pixel P, thereby displaying an image.

Next, a production method of the liquid crystal display panel 50a of the present embodiment will be described. Here, the production method of the liquid crystal display panel 50a of the present embodiment includes an active matrix substrate fabrication step, a counter substrate fabrication step, and a liquid crystal injection step.

<Active Matrix Substrate Fabrication Step>

First, on a transparent substrate 10a such as a glass substrate, a silicon nitride film, a silicon oxide film, a multilayer film of such films, or the like are formed by, for example, chemical vapor deposition (CVD) to have a thickness of about 300 nm, thereby forming an underlying film.

Subsequently, on the entire substrate on which the underlying film has been formed, an amorphous silicon film is formed by, for example, CVD to have a thickness of about 50 nm, and is then polycrystallized by annealing by, for example, irradiation with a laser beam, thereby forming a polysilicon film. Photolithography, etching, and resist pattern removal and cleaning are performed with respect to the polysilicon film, thereby forming a semiconductor layer 11a, and others.

After that, on the entire substrate on which the semiconductor layer 11a has been formed, a silicon nitride film, a silicon oxide film, a multilayer film of such films, or the like is formed by, for example, CVD to have a thickness of about 100 nm, thereby forming a gate insulating film 12.

Further, on the entire substrate on which the gate insulating film 12 has been formed, a metal film such as a tungsten film is formed by, for example, sputtering to have a thickness of about 300 nm. Then, photolithography, etching, and resist pattern removal and cleaning are performed with respect to the metal film, thereby forming gate lines 13 including gate electrodes (13).

Subsequently, in the semiconductor layer 11a on the substrate on which the gate lines 13 have been formed, an impurity such as phosphorus is implanted by using the gate electrodes (13) as a mask, thereby forming channel regions, source regions, and drain regions in the semiconductor layer 11a.

Further, on the entire substrate on which the channel regions, the source regions, and the drain regions in the semiconductor layer 11a have been formed, an inorganic insulating film such as a silicon nitride film, a silicon oxide film, a multilayer film of such films, or the like is formed by, for example, CVD to have a thickness of about 700 nm. Then, photolithography, etching, and resist pattern removal and cleaning are performed with respect to a multilayer film including the inorganic insulating film and the gate insulating film 12 under the inorganic insulating film, thereby forming an interlayer insulating film 14 in which contact holes have been formed.

Then, on the entire substrate on which the interlayer insulating film 14 has been formed, a titanium film (having a thickness of about 100 nm), an aluminum film (having a thickness of about 500 nm), a titanium film (having a thickness of about 100 nm), and the like are sequentially formed by, for example, sputtering, thereby forming a multilayer film. Then, photolithography, etching, and resist pattern removal and cleaning are performed with respect to the multilayer film, thereby forming drain electrodes 15b including source electrodes (15a).

Further, the substrate on which the source lines 15a and the drain electrodes 15b have been formed is heated in a hydrogen atmosphere to about 400-500° C., thereby terminating dangling bonds (unsaturated bonds) of the semiconductor layer 11a.

After that, on the entire substrate in which the dangling bonds of the semiconductor layer 11a have been terminated, acrylic photosensitive resin is applied by, for example, spin coating or slit coating to have a thickness of about 2 μm, thereby forming a coating film. Then the coating film is exposed, developed, and baked, thereby forming a protective insulating film 16.

Subsequently, on the entire substrate on which the protective insulating film 16 has been formed, a transparent conductive film such as an indium tin oxide (ITO) film (having a thickness of about 100 nm) is formed by, for example, sputtering. Then, photolithography, etching, and resist pattern removal and cleaning are performed with respect to the transparent conductive film, thereby forming transparent electrodes 17a and 17b.

Then, on the entire substrate on which the transparent electrodes 17a and 17b have been formed, a titanium film (having a thickness of about 100 nm), an aluminum film (having a thickness of about 500 nm), a titanium film (having a thickness of about 100 nm), and the like are sequentially formed by sputtering, thereby forming a multilayer film. Then, photolithography, etching, and resist pattern removal and cleaning are performed with respect to the multilayer film, thereby forming capacitor lines 18.

Further, on the entire substrate on which the capacitor lines 18 have been formed, an inorganic insulating film such as a silicon nitride film, a silicon oxide film, a multilayer film of such films, or the like is formed by, for example, CVD to have a thickness of about 50 nm. Then, photolithography, etching, and resist pattern removal and cleaning are performed with respect to the inorganic insulating film, thereby forming a capacitor insulating film 19.

Then, on the entire substrate on which the capacitor insulating film 19 has been formed, a transparent conductive film such as an ITO film (having a thickness of about 100 nm) is formed by, for example, sputtering. After that, photolithography, etching, and resist pattern removal and cleaning are performed with respect to the transparent conductive film, thereby forming pixel electrodes 20a.

Finally, on the entire substrate on which the pixel electrodes 20a have been formed, a polyimide-based resin film is applied by, for example, spin coating, slit coating, or a printing method, thereby forming a coating film. Then, the coating film is baked and rubbed, thereby forming an alignment layer.

In this way, an active matrix substrate 30a can be fabricated.

<Counter Substrate Fabrication Step>

First, on the entire transparent substrate 10b such as a glass substrate, acrylic photosensitive resin colored black is applied by, for example, spin coating or slit coating, thereby forming a coating film. Then, the coating film is exposed, developed, and baked, thereby forming a black matrix 21 to have a thickness of about 2 μm.

Subsequently, on the entire substrate on which the black matrix 21 has been formed, acrylic photosensitive resin colored red, green, or blue is applied by, for example, spin coating or slit coating, thereby forming a coating film. Then, the coating film is exposed, developed, and baked, thereby forming a colored layer 22 of a selected color (e.g., a red layer) to have a thickness of about 2 μm. Further, a similar step is repeated for the other two colors, thereby forming colored layers 22 of the other two colors (e.g., a green layer and a blue layer) to have a thickness of about 2 μm.

Further, on the entire substrate on which the colored layers 22 have been formed, a transparent conductive film such as an ITO film is formed by, for example, sputtering to have a thickness of about 100 nm, thereby forming a common electrodes 23.

Finally, on the entire substrate on which the common electrodes 23 have been formed, a polyimide-based resin film is formed by, for example, spin coating, slit coating, or a printing method, thereby forming a coating film. Then, the coating film is baked, and rubbed, thereby forming an alignment layer.

In this way, a counter substrate 40 can be fabricated.

<Liquid Crystal Injection Step>

First, for example, on a surface of the counter substrate 40 fabricated in the counter substrate fabrication step, a sealing material made of ultraviolet (UV) curable thermosetting resin or the like is formed to have a frame shape by using a dispenser. Then, in a region surrounded by the sealing material, a liquid crystal material is dropped.

Subsequently, the counter substrate 40 on which the liquid crystal material has been dropped and the active matrix substrate 30a fabricated in the active matrix substrate fabrication step are bonded to each other under reduced pressure, thereby forming a bonded structure. Then, the bonded structure is exposed to an atmospheric pressure, thereby applying pressure to the surface and the back face of the bonded structure.

Further, the sealing material sandwiched between the bonded structure is irradiated with UV light, and then the bonded structure is heated, thereby curing the sealing material.

Finally, the bonded structure in which the sealing material has been cured is divided by, for example, dicing, thereby removing unnecessary portions of the bonded structure.

In this way, a liquid crystal display panel 50a of the present embodiment can be produced.

Figure 7:
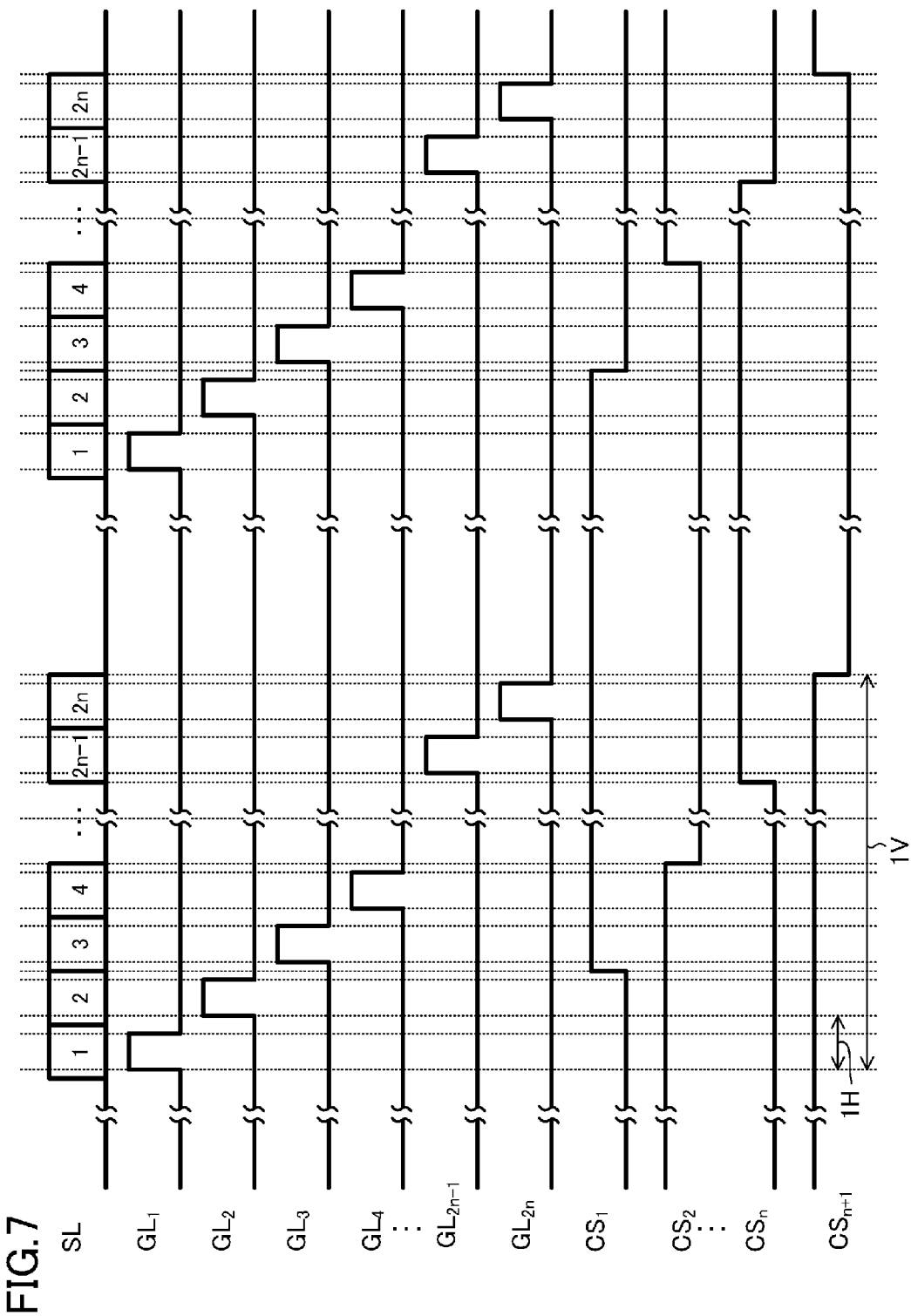
FIG. 7 is a timing diagram for driving the liquid crystal display panel according to the first embodiment.

Next, a method for driving the liquid crystal display panel 50a of the present embodiment will be described with reference to FIGS. 1, 2, and 7. Here, FIG. 7 is a timing diagram for driving the liquid crystal display panel 50a. In FIG. 1, (+) and (−) after reference symbol 15a each represent the polarity of a voltage of a source signal input to the source line 15a, and (+) and (−) after reference symbol P each represent the polarity of a voltage applied to the sub-pixel P.

Specifically, the liquid crystal display panel 50a can be driven by repeating (1)-(6) described below.

(1) A signal input to a gate line 13 ($GL_1$) is changed from a low electric potential to a high electric potential, thereby turning on the TFTs 5a of the sub-pixels Pa-Pd connected to the $GL_1$, and a source signal is input to each source line 15a, thereby applying the voltage of the source signal to the pixel electrodes 20a of the sub-pixels Pa-Pd connected to the $GL_1$. After that, the signal input to the gate line 13 ($GL_1$) is changed from a high electric potential to a low electric potential, thereby turning off the TFTs 5a of the sub-pixels Pa-Pd connected to the $GL_1$.

(2) A signal input to a gate line 13 ($GL_2$) is changed from a low electric potential to a high electric potential, thereby turning on the TFTs 5a of the sub-pixels Pe-Ph connected to the $GL_2$, and a source signal is input to each source line 15a, thereby applying the voltage of the source signal to the pixel electrodes 20a of the sub-pixels Pe-Ph connected to the $GL_2$. After that, the signal input to the gate line 13 ($GL_2$) is changed from a high electric potential to a low electric potential, thereby turning off the TFTs 5a of the sub-pixels Pe-Ph connected to the $GL_2$.

(3) The signal input to a capacitor line 18 ($CS_1$) is changed from a low electric potential to a high electric potential, thereby increasing the voltage applied to the pixel electrodes 20a of the sub-pixels Pb, Pd, Pf, and Ph connected to the capacitor line 18 ($CS_1$) and having a positive polarity (see FIG. 1) to a predetermined voltage.

(4) The signal input to a gate line 13 ($GL_3$) is changed from a low electric potential to a high electric potential, thereby turning on the TFTs 5a of sub-pixels Pi-Pl connected to the $GL_3$, and a source signal is input to each source line 15a, thereby applying the voltage of the source signal to the pixel electrodes 20a of the sub-pixels Pi-Pl connected to the $GL_3$. Then, the signal input to the gate line 13 ($GL_3$) is changed from a high electric potential to a low electric potential, thereby turning off the TFTs 5a of the sub-pixels Pi-Pl connected to the $GL_3$.

(5) A signal input to a gate line 13 (GL$_4$) is changed from a low electric potential to a high electric potential, thereby turning on the TFTs 5a of the sub-pixels Pm-Pp connected to the GL$_4$, and a source signal is input to each source line 15a, thereby applying the voltage of the source signal to the pixel electrodes 20a of the sub-pixels Pm-Pp connected to the GL$_4$. After that, the signal input to the gate line 13 (GL$_4$) is changed from a high electric potential to a low electric potential, thereby turning off the TFTs 5a of the sub-pixels Pm-Pp connected to the GL$_4$.

(6) A signal input to a capacitor line 18 (CS$_2$) is changed from a high electric potential to a low electric potential, thereby reducing the voltage applied to the pixel electrodes 20a of the sub-pixel Pa, Pc, Pe, Pg, Pj, Pl, Pn, and Pp connected to the capacitor line 18 (CS$_2$) and having a negative polarity (see FIG. 1) to a predetermined voltage.

In this way, not only the gate lines 13 but also the capacitor lines 18 are scanned, so that in source line inversion drive in which the polarity of a source signal input to each source line 15a is inverted for every line, the amplitude of a voltage applied to each source line 15a can be reduced, and the panel driving power can be reduced. Here, a drive circuit for driving the liquid crystal display panel 50a may be monolithically formed on the active matrix substrate 30a, or may be mounted as a chip on the active matrix substrate 30a.

As described above, in the active matrix substrate 30a of the present embodiment and the liquid crystal display panel 50a including the same, the auxiliary capacitor 6 of each sub-pixel P includes the transparent electrode 17a or 17b, the pixel electrode 20a, and the capacitor insulating film 19 provided between the transparent electrode 17a or 17b and the pixel electrode 20a. Therefore, most portions of a region of the sub-pixel P which forms the auxiliary capacitor 6 have a light transmitting property. Thus, even when the area of the sub-pixel P which is occupied by the auxiliary capacitor 6 increases, the aperture ratio is not lowered, so that the aperture ratio of each sub-pixel P can be improved. Moreover, the TFTs 5 are connected, for each pair of the sub-pixels, to the source lines 15a different from each other, the sub-pixels P in the pair being adjacent to each other in the column direction and being arranged in a corresponding one of the wide spaces each provided between adjacent two of the gate lines 13 along the column direction of the sub-pixels P arranged in rows and columns Therefore, even if polarity inversion of a signal input to a source line is not performed every two horizontal periods (2H), display on the liquid crystal display panel is similar to that in the case where polarity inversion of a signal input to a source line is performed every two horizontal periods (2H) in a liquid crystal display panel having a common structure, so that degradation in image quality can be reduced. Thus, when the liquid crystal display panel 50a including the active matrix substrate 30a is driven, it is not necessary to perform polarity inversion every one horizontal period (1H), so that the amount of voltage change of the source line 15a in one vertical period (1V) is reduced. This reduces electric power required to charge/discharge the source line 15a, so that the driving power of the liquid crystal display panel 50a can be reduced, and degradation in image quality due to insufficient charging of the pixel electrode 20a can be reduced. Furthermore, each of the transparent electrodes 17a and 17b is shared by a pair of the sub-pixels P which are adjacent to each other in the column direction and are arranged in a corresponding one of the wide spaces each provided between adjacent two of the gate lines 13, wherein the transparent electrodes adjacent to each other in the row direction receive different signals. Therefore, when the liquid crystal display panel 50a including the active matrix substrate 30a is driven, not only the gate lines 13 but also the transparent electrodes 17a and 17b are sequentially scanned along the column direction and are driven, so that the amplitude of a voltage applied to the source line 15a can be reduced, and the driving power of the liquid crystal display panel 50a can be further reduced. Thus, in the active matrix substrate 30a and the liquid crystal display panel 50a including the same, the aperture ratio of each sub-pixel P can be improved, degradation in image quality can be reduced, and the panel driving power can be reduced.

In the active matrix substrate 30a of the present embodiment, each capacitor line 18 is provided in a corresponding one of the narrow spaces each provided between adjacent two of the gate lines 13, wherein the transparent electrodes 17a and 17b, each of which is shared by the pair of sub-pixels P and which are adjacent to each other in the row direction, are connected to the capacitor lines different from each other. Therefore, the transparent electrodes 17a and 17b can be sequentially scanned along the column direction by sequentially scanning the capacitor lines 18. Here, the quantity of the capacitor lines 18 is (the quantity of gate lines 13)×½+1, and is substantially ½ of that in the case where a capacitor line is provided in each spaces between gate lines as in the liquid crystal display device described in Patent Document 2. Thus, even when light shielding capacitor lines 18 are provided, the aperture ratio of each sub-pixel P can be improved. Here, the quantity y of the capacitor lines 18 is x/2+1 when the quantity x of the gate lines 13 is an even number, and the quantity y of the capacitor lines 18 is x/2+1.5 when the number x of the gate lines 13 is an odd number.

In the active matrix substrate 30a of the present embodiment, each capacitor line 18 is in contact with the transparent electrodes 17a and the transparent electrodes 17b. Therefore, each capacitor line 18 can be connected to the transparent electrodes 17a and the transparent electrodes 17b without forming a contact hole. Moreover, a metal interconnect having a lower electrical resistance than the transparent electrodes 17a and 17b is used as the capacitor line 18, and thus a signal delay in the transparent electrodes 17a and 17b can be reduced.

Second Embodiment of the Invention

Figure 8:
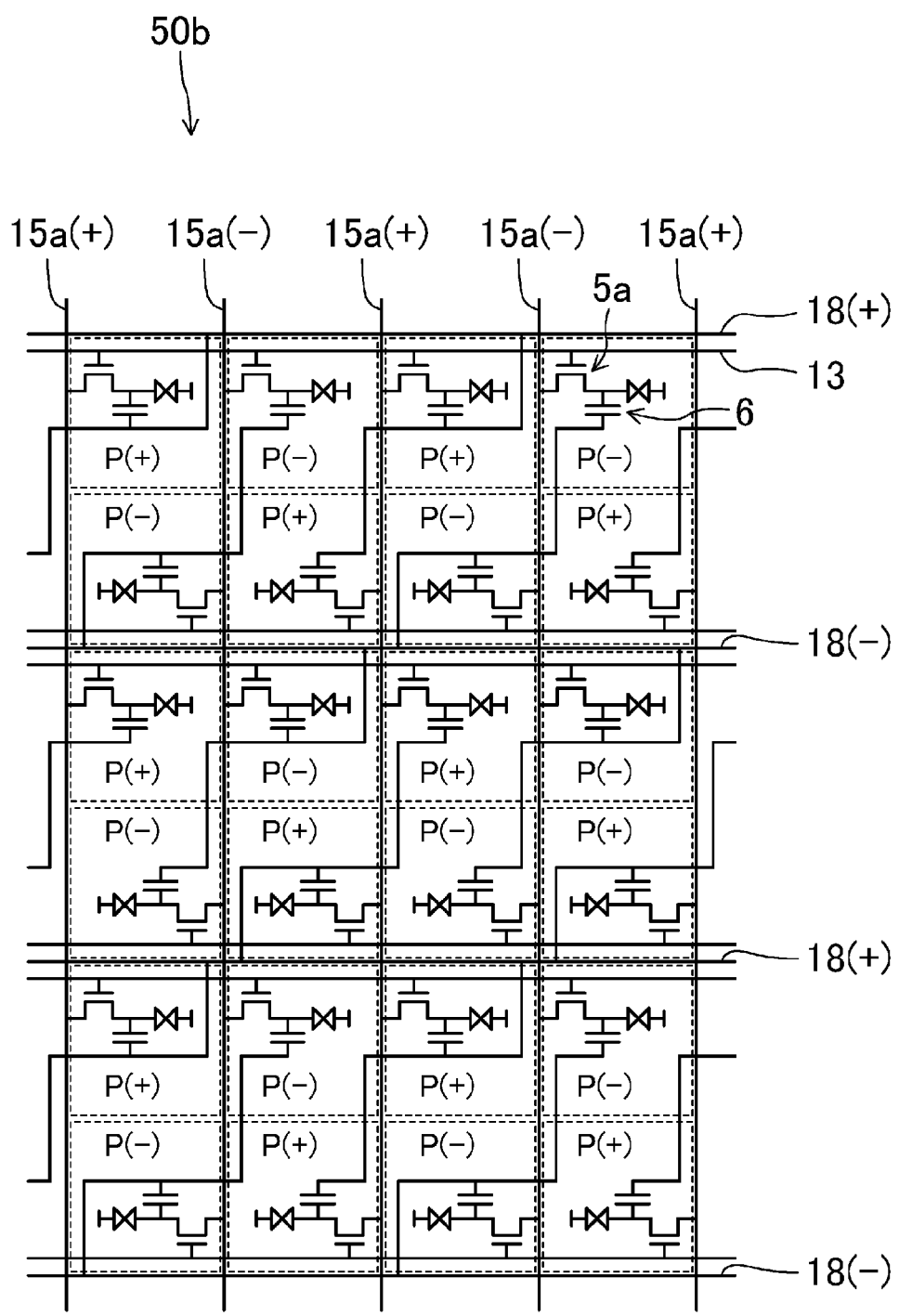
FIG. 8 is an equivalent circuit diagram illustrating a liquid crystal display panel according to a second embodiment.
Figure 9:
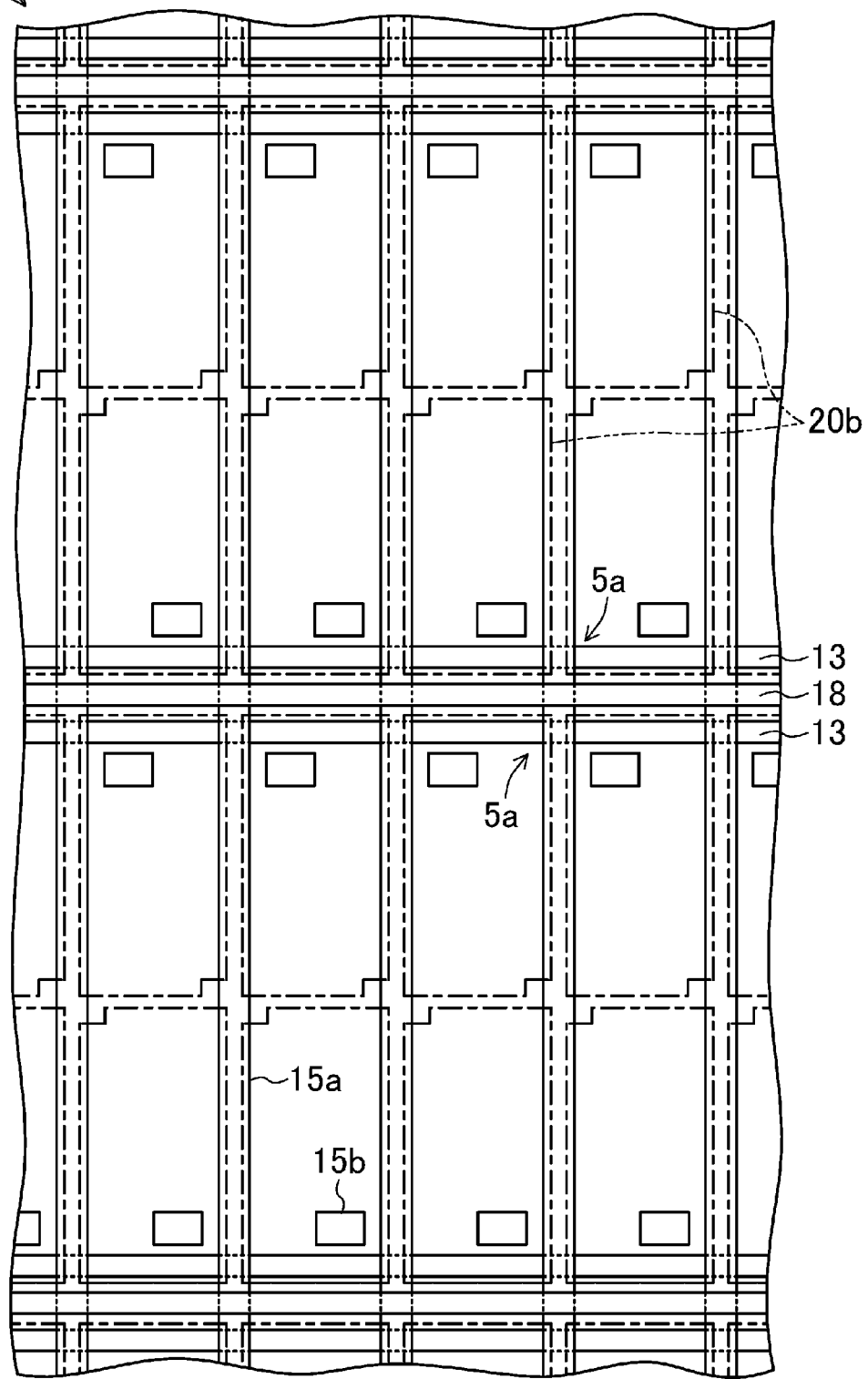
FIG. 9 is a plan view illustrating an active matrix substrate included in the liquid crystal display panel according to the second embodiment.
Figure 10:
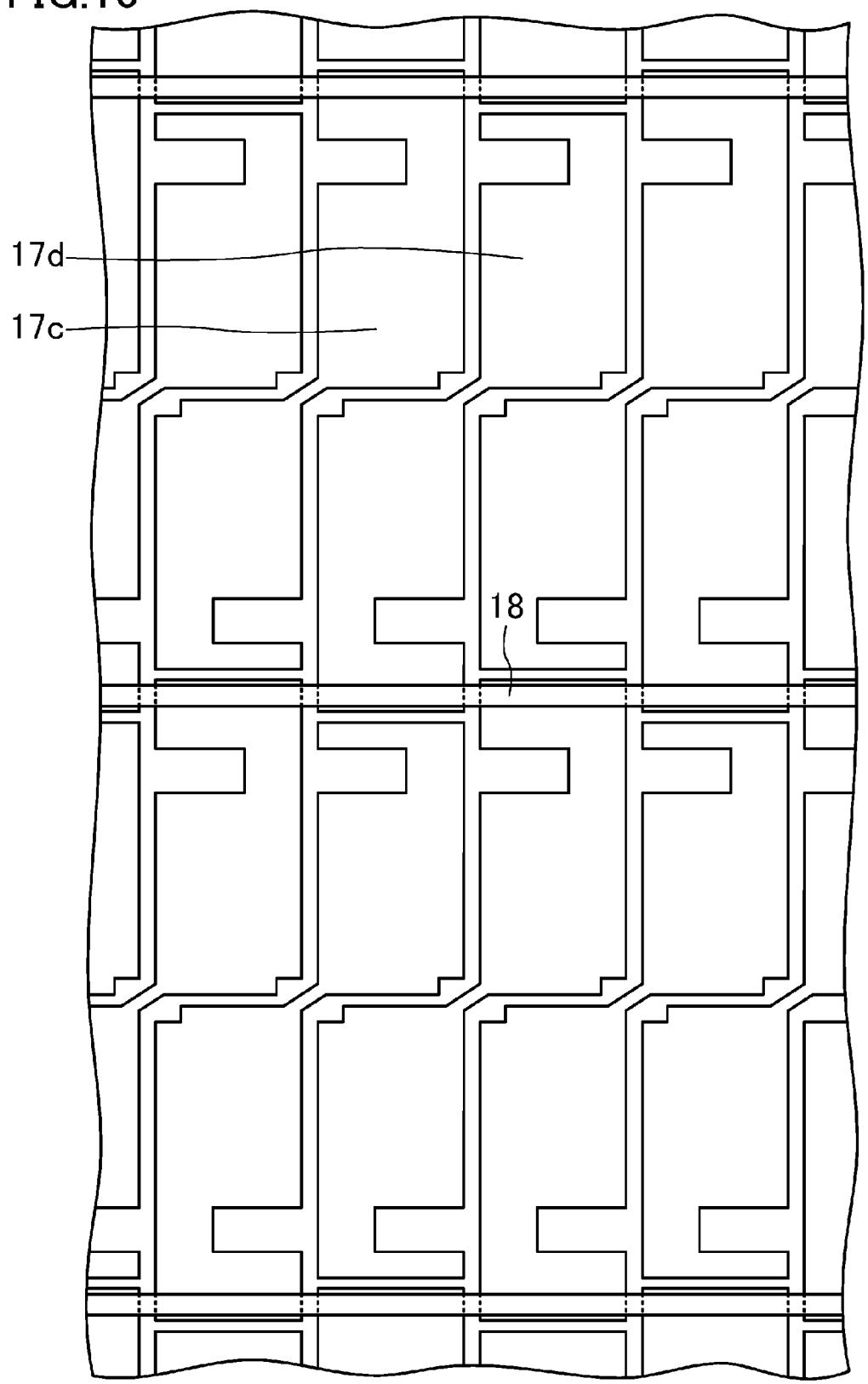
FIG. 10 is a plan view illustrating transparent electrodes and capacitor lines included in the active matrix substrate according to the second embodiment.
Figure 11:
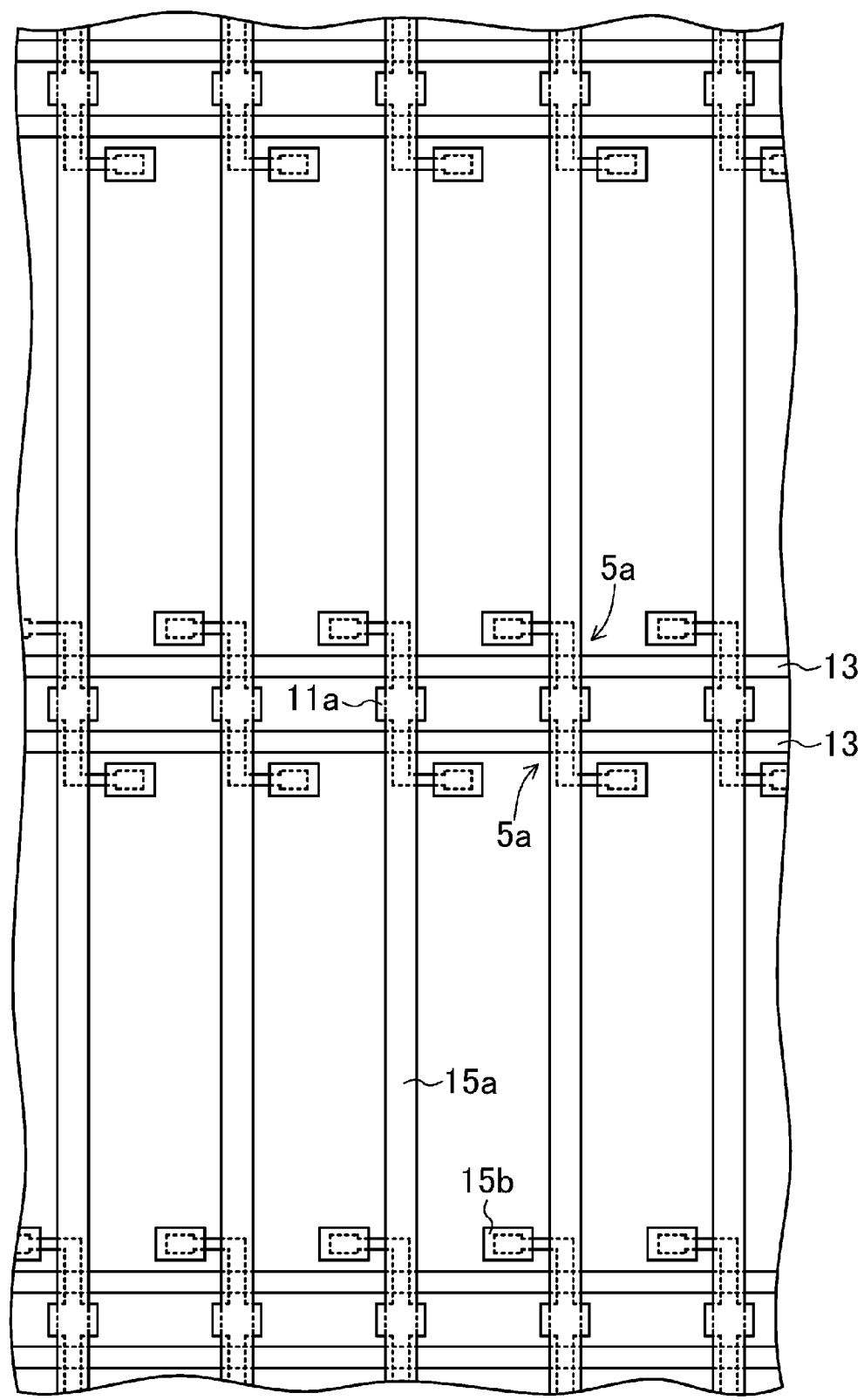
FIG. 11 is a plan view illustrating a semiconductor layer, a gate layer, and a source layer included in the active matrix substrate according to the second embodiment.

FIGS. 8-11 show a second embodiment of an active matrix substrate according to the present invention and a liquid crystal display panel including the same. Specifically, FIG. 8 is an equivalent circuit diagram of a liquid crystal display panel 50b of the present embodiment. FIG. 9 is a plan view illustrating an active matrix substrate 30b included in the liquid crystal display panel 50b. FIG. 10 is a plan view of transparent electrodes 17c and 17d and capacitor lines 18 included in the active matrix substrate 30b of FIG. 9. FIG. 11 is a plan view illustrating a semiconductor layer 11a, a gate layer such as gate lines 13, and a source layer such as source lines 15a included in the active matrix substrate 30b of FIG. 9. Here, in FIG. 9, pixel electrodes 20b located at an uppermost layer are indicated by a dash-double dotted line. In the following embodiments, the same reference numerals as those shown in FIGS. 1-7 are used to represent equivalent elements, and the detailed explanation thereof will be omitted.

The first embodiment has described the active matrix substrate 30a in which each transparent electrode is shared by a pair of the sub-pixels P adjacent to each other in the column direction of the sub-pixels P, whereas the present embodiment will describe the active matrix substrate 30b in which each of transparent electrodes is shared by a pair of sub-pixels P adjacent to each other in a diagonal direction.

The liquid crystal display panel 50b includes the active matrix substrate 30b and a counter substrate 40 (see FIGS. 5 and 6) facing each other, a liquid crystal layer 35 (see FIGS. 5 and 6) provided between the active matrix substrate 30b and the counter substrate 40, and a frame-like sealing material (not shown) for bonding the active matrix substrate 30b and the counter substrate 40 to each other and for sealing the liquid crystal layer 35 between the active matrix substrate 30b and the counter substrate 40. Here, a display region for displaying an image is defined in a region of the liquid crystal display panel 50b surrounded by the sealing material, and in the display region, a plurality of pixels are arranged in rows and columns. In each pixel, as illustrated in FIG. 8, for example, sub-pixels P for displaying gradation of a red color, sub-pixels P for displaying gradation of a green color, and sub-pixels P for displaying gradation of a blue color are arranged, so that in the liquid crystal display panel 50b, the plurality of sub-pixels P are provided in rows and columns. The liquid crystal display panel 50b forms a liquid crystal display device together with, for example, a backlight (not shown) provided at a back side of the liquid crystal display panel 50b.

As illustrated in FIGS. 8, 9, and 11, the active matrix substrate 30b includes transparent substrate 10a (see FIGS. 5 and 6), the plurality of gate lines 13 each two of which are arranged in every other space extending in a row direction (a lateral direction in FIGS. 8-11) between the plurality of sub-pixels P on the transparent substrate 10a such that the gate lines 13 extend parallel to each other with narrow spaces and wide spaces being alternately provided therebetween, the plurality of source lines 15a each of which is arranged in a corresponding one of spaces extending in a column direction (a longitudinal direction in FIGS. 8-11) between the sub-pixels P such that the source lines 15a extend parallel to each other, a plurality of TFTs 5a each provided as a switching element at a corresponding one of intersections of the gate lines 13 and the source lines 15a, a protective insulating film 16 (see FIGS. 5 and 6) covering the TFTs 5a, a plurality of transparent electrodes 17c and 17d provided on the protective insulating film 16, a capacitor insulating film 19 (see FIGS. 5 and 6) covering the transparent electrodes 17c and 17d, the plurality of pixel electrodes 20b provided in rows and columns on the capacitor insulating film 19, and each connected to a corresponding one of the TFTs 5a, and an alignment layer (not shown) covering the pixel electrodes 20b. Here, in the active matrix substrate 30b, as illustrated in FIGS. 8-11, an auxiliary capacitor 6 of each sub-pixel P includes the transparent electrode 17c or 17d, the pixel electrode 20b, and the capacitor insulating film 19 provided between the transparent electrode 17c or 17d and the pixel electrode 20b. In the active matrix substrate 30b, as illustrated in FIGS. 8 and 11, the TFTs 5a are connected, for each sub-pixel P along the column direction, to the source lines 15a different from each other.

As illustrated in FIG. 10, each of the transparent electrodes 17c and 17d is shared by a pair of the sub-pixels P which are adjacent to each other in a diagonal direction of the sub-pixels P and are arranged in a corresponding one of the wide spaces each provided between adjacent two of the gate lines 13. As illustrated in FIG. 10, the transparent electrodes 17c and 17d are connected to the capacitor lines 18 different from each other such that the transparent electrodes 17c and 17d adjacent to each other in the row direction receive different signals. Here, as illustrated in FIG. 10, on the transparent electrodes 17c and 17d, each capacitor line 18 is provided in a corresponding one of the narrow spaces each provided between adjacent two of the gate lines 13.

In the liquid crystal display panel 50b having the above-described configuration, a predetermined voltage for each sub-pixel P is applied to the liquid crystal layer 35 provided between each pixel electrode 20b on the active matrix substrate 30b and the common electrode 23 on the counter substrate 40 to change the alignment of the liquid crystal layer 35 so that the transmittance of light transmitted in the panel is adjusted in each sub-pixel P, thereby displaying an image.

The liquid crystal display panel 50b of the present embodiment can be produced by modifying the pattern shapes of the semiconductor layer 11a, the drain electrodes 15b, the transparent electrodes 17a and 17b, and the pixel electrodes 20a in the fabrication step of the active matrix substrate of the first embodiment.

As described above, in the active matrix substrate 30b of the present embodiment and the liquid crystal display panel 50b including the same, the auxiliary capacitor 6 of each sub-pixel P includes the transparent electrode 17c or 17d, the pixel electrode 20b, and the capacitor insulating film 19 provided between the transparent electrode 17c or 17d and the pixel electrode 20b. Therefore, most portions of a region of the sub-pixel P which forms the auxiliary capacitor 6 have a light transmitting property. Thus, even when the area of the sub-pixel P which is occupied by the auxiliary capacitor 6 increases, the aperture ratio is not lowered, so that the aperture ratio of each sub-pixel P can be improved. Moreover, the TFTs 5 are connected, for each sub-pixel P along the column direction of the sub-pixels P arranged in rows and columns, to the source lines 15a different from each other. Therefore, even if polarity inversion of a signal input to a source line is not performed every one horizontal periods (1H), display on the liquid crystal display panel is similar to that in the case where polarity inversion of a signal input to a source line is performed every one horizontal periods (1H) in a liquid crystal display panel having a common structure, so that degradation in image quality can be reduced. Thus, when the liquid crystal display panel 50b including the active matrix substrate 30b is driven, it is not necessary to perform polarity inversion every one horizontal period (1H), so that the amount of voltage change of the source line 15a in one vertical period (1V) is reduced. This reduces electric power required to charge/discharge the source line 15a, so that the driving power of the liquid crystal display panel 50b can be reduced, and degradation in image quality due to insufficient charging of the pixel electrode 20b can be reduced. Furthermore, each of the transparent electrodes 17c and 17d is shared by a pair of the sub-pixels P which are adjacent to each other in a diagonal direction and are arranged in a corresponding one of the wide spaces each provided between adjacent two of the gate lines 13, wherein the transparent electrodes adjacent to each other in the row direction receive different signals. Therefore, when the liquid crystal display panel 50b including the active matrix substrate 30b is driven, not only the gate lines 13 but also the transparent electrodes 17c and 17d are sequentially scanned along the column direction and are driven, so that the amplitude of a voltage applied to the source line 15a can be reduced, and the driving power of the liquid crystal display panel 50b can be further reduced. Thus, in the active matrix substrate 30b and the liquid crystal display panel 50a including the same, the aperture ratio of each sub-pixel P can be improved, degradation in image quality can be reduced, and the panel driving power can be reduced.

Here, in the active matrix substrate 30b, the polarities of the liquid crystal capacitor and the auxiliary capacitor can be inverted along the column direction for every sub-pixel P, so that display with higher quality can be achieved.

Third Embodiment of the Invention

Figure 12:
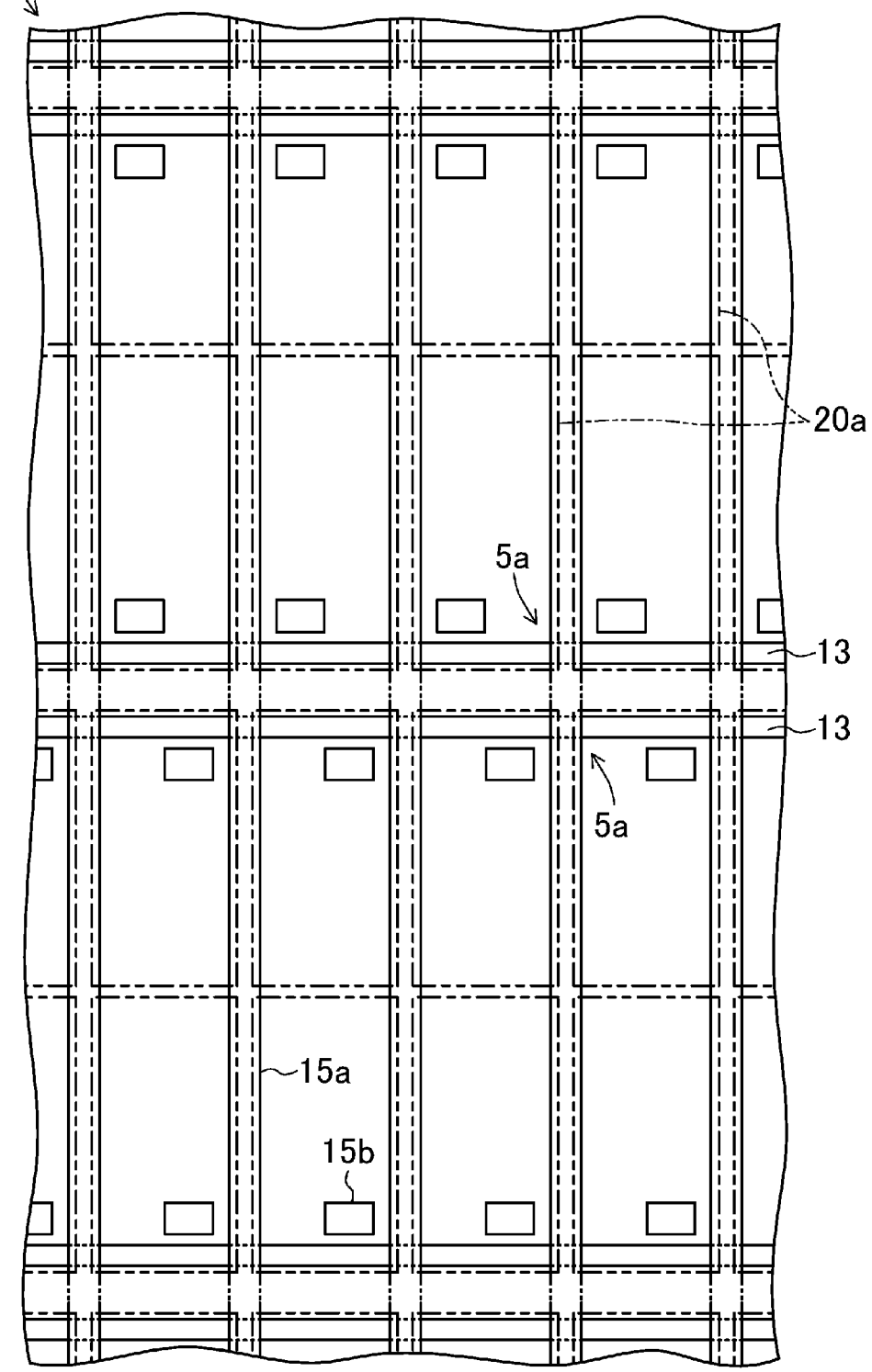
FIG. 12 is a plan view illustrating an active matrix substrate included in a liquid crystal display panel according to a third embodiment.
Figure 13:
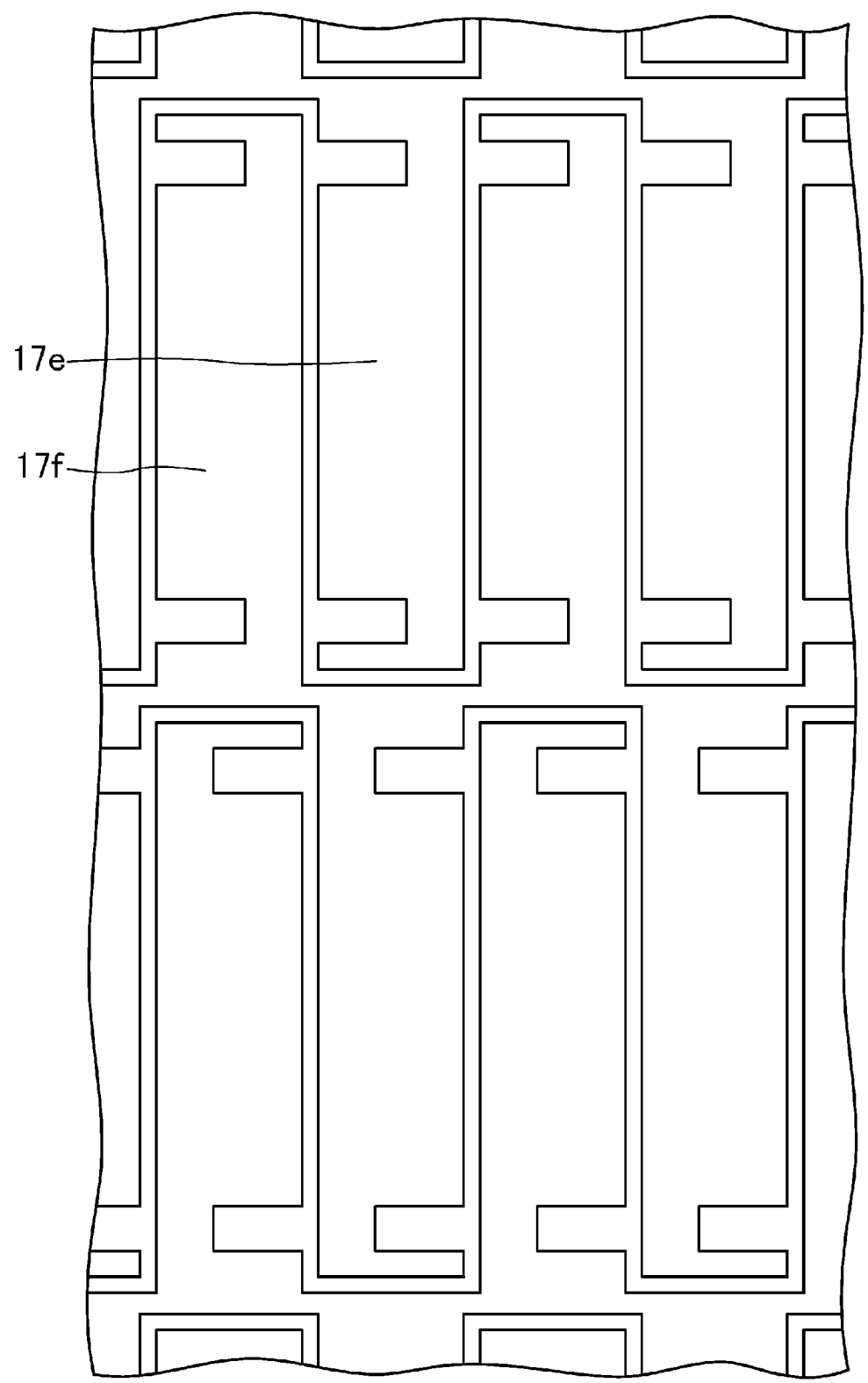
FIG. 13 is a plan view illustrating transparent electrodes included in the active matrix substrate according to the third embodiment.
Figure 14:
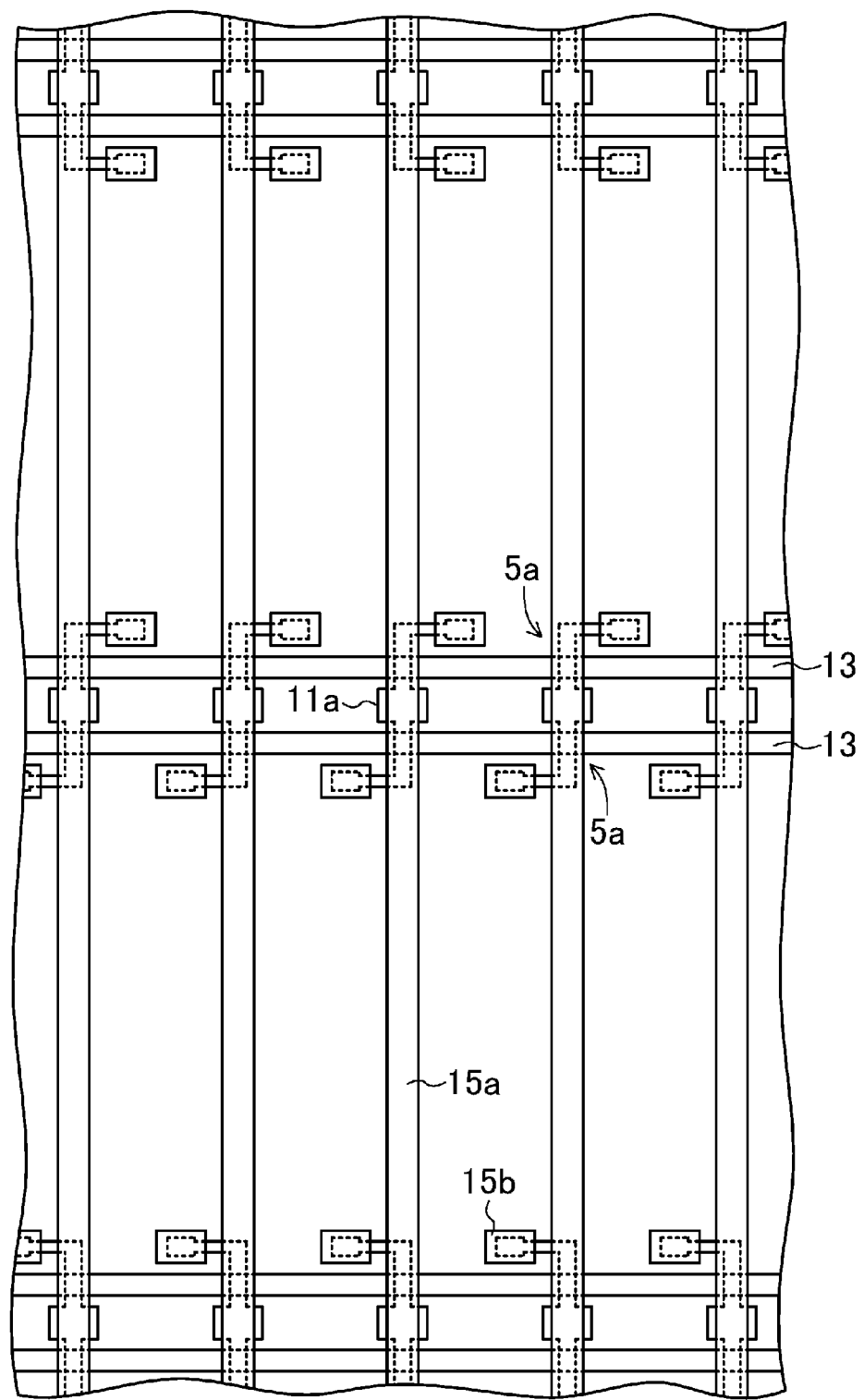
FIG. 14 is a plan view illustrating a semiconductor layer, a gate layer, and a source layer included in the active matrix substrate according to the third embodiment.

FIGS. 12-14 show a third embodiment of an active matrix substrate according to the present invention and a liquid crystal display panel including the same. Specifically, FIG. 12 is a plan view illustrating an active matrix substrate 30c included in the liquid crystal display panel of the present embodiment. FIG. 13 is a plan view of transparent electrodes 17e and 17f included in the active matrix substrate 30c of FIG. 12. FIG. 14 is a plan view illustrating a semiconductor layer 11a, a gate layer such as gate lines 13, and a source layer such as source lines 15a included in the active matrix substrate 30c of FIG. 12. Here, in FIG. 12, pixel electrodes 20a located at an uppermost layer are indicated by a dash-double dotted line.

The first and second embodiments have described the active matrix substrates 30a and 30b including the capacitor lines 18, whereas the present embodiment will describe the active matrix substrate 30c including no capacitor line 18.

The liquid crystal display panel of the present embodiment includes the active matrix substrate 30c and a counter substrate 40 (see FIGS. 5 and 6) facing each other, a liquid crystal layer 35 (see FIGS. 5 and 6) provided between the active matrix substrate 30c and the counter substrate 40, and a frame-like sealing material (not shown) for bonding the active matrix substrate 30c and the counter substrate 40 to each other and for sealing the liquid crystal layer 35 between the active matrix substrate 30c and the counter substrate 40.

As illustrated in FIGS. 8, 9, and 11, the active matrix substrate 30c includes transparent substrate 10a (see FIGS. 5 and 6), the plurality of gate lines 13 each two of which are arranged in every other space extending in a row direction (a lateral direction in FIGS. 12-14) between the plurality of sub-pixels P on the transparent substrate 10a such that the gate lines 13 extend parallel to each other with narrow spaces and wide spaces are alternately provided therebetween, the plurality of source lines 15a each of which is arranged in a corresponding one of spaces extending in a column direction (a longitudinal direction in FIGS. 12-14) between the sub-pixels P such that the source lines 15a extend parallel to each other, a plurality of TFTs 5a each provided as a switching element at a corresponding one of intersections of the gate lines 13 and the source lines 15a, a protective insulating film 16 (see FIGS. 5 and 6) covering the TFTs 5a, a plurality of transparent electrodes 17e and 17f provided on the protective insulating film 16, a capacitor insulating film 19 (see FIGS. 5 and 6) covering the transparent electrodes 17e and 17f, the plurality of pixel electrodes 20a provided in rows and columns on the capacitor insulating film 19, and each connected to a corresponding one of the TFTs 5a, and an alignment layer (not shown) covering the pixel electrodes 20a. Here, in the active matrix substrate 30c, as illustrated in FIGS. 12-14, an auxiliary capacitor 6 of each sub-pixel P includes the transparent electrode 17e or 17f, the pixel electrode 20a, and the capacitor insulating film 19 provided between the transparent electrode 17e or 17f and the pixel electrode 20a. In the active matrix substrate 30c, as illustrated in FIGS. 12-14, the TFTs 5a are connected, for each pair of the sub-pixels, the source lines 15a different from each other, the sub-pixels P in the pair being adjacent to each other in the column direction and being arranged in a corresponding one of the wide spaces between each two of the gate lines 13 along the column direction.

As illustrated in FIG. 13, each of the transparent electrodes 17e and 17f is shared by a pair of the sub-pixels P which are adjacent to each other in the column direction and are arranged in a corresponding one of the wide spaces each provided between adjacent two of the gate lines 13. As illustrated in FIG. 13, the transparent electrodes 17e and 17f extend in the row direction and protrude in a lateral direction (column direction) in a staggered manner so that the transparent electrodes 17e and 17f adjacent to each other in the row direction receive different signals.

The liquid crystal display panel of the present embodiment can be produced by modifying the pattern shapes of the transparent electrodes 17a and 17b in the fabrication step of the active matrix substrate of the first embodiment.

As described above, in the active matrix substrate 30c of the present embodiment and the liquid crystal display panel including the same, similar to the first embodiment, the auxiliary capacitor 6 of each sub-pixel P includes the transparent electrode 17e or 17f, the pixel electrode 20a, and the capacitor insulating film 19 provided between the transparent electrode 17e or 17f and the pixel electrode 20a, the TFTs 5a are connected, for each pair of the sub-pixels P, to the source lines 15a different from each other, the sub-pixels P in the pair being adjacent to each other in the column direction and being arranged in a corresponding one of the wide spaces each provided between adjacent two of the gate lines 13 along the column direction of the sub-pixels P arranged in rows and columns, and each of the transparent electrodes 17e and 17f is shared by a pair of the sub-pixels P which are adjacent to each other in the column direction and are arranged in a corresponding one of the wide spaces each provided between adjacent two of the gate lines 13, wherein the transparent electrodes adjacent to each other in the row direction receive different signals. Thus, the aperture ratio of each sub-pixel P can be improved, degradation in image quality can be reduced, and the panel driving power can be reduced.

In the active matrix substrate 30c of the present embodiment and a liquid crystal display panel including the same, the capacitor lines 18 of the first embodiment are omitted, so that fabrication steps can be reduced, which can reduce fabrication costs.

Fourth Embodiment of the Invention

Figure 15:
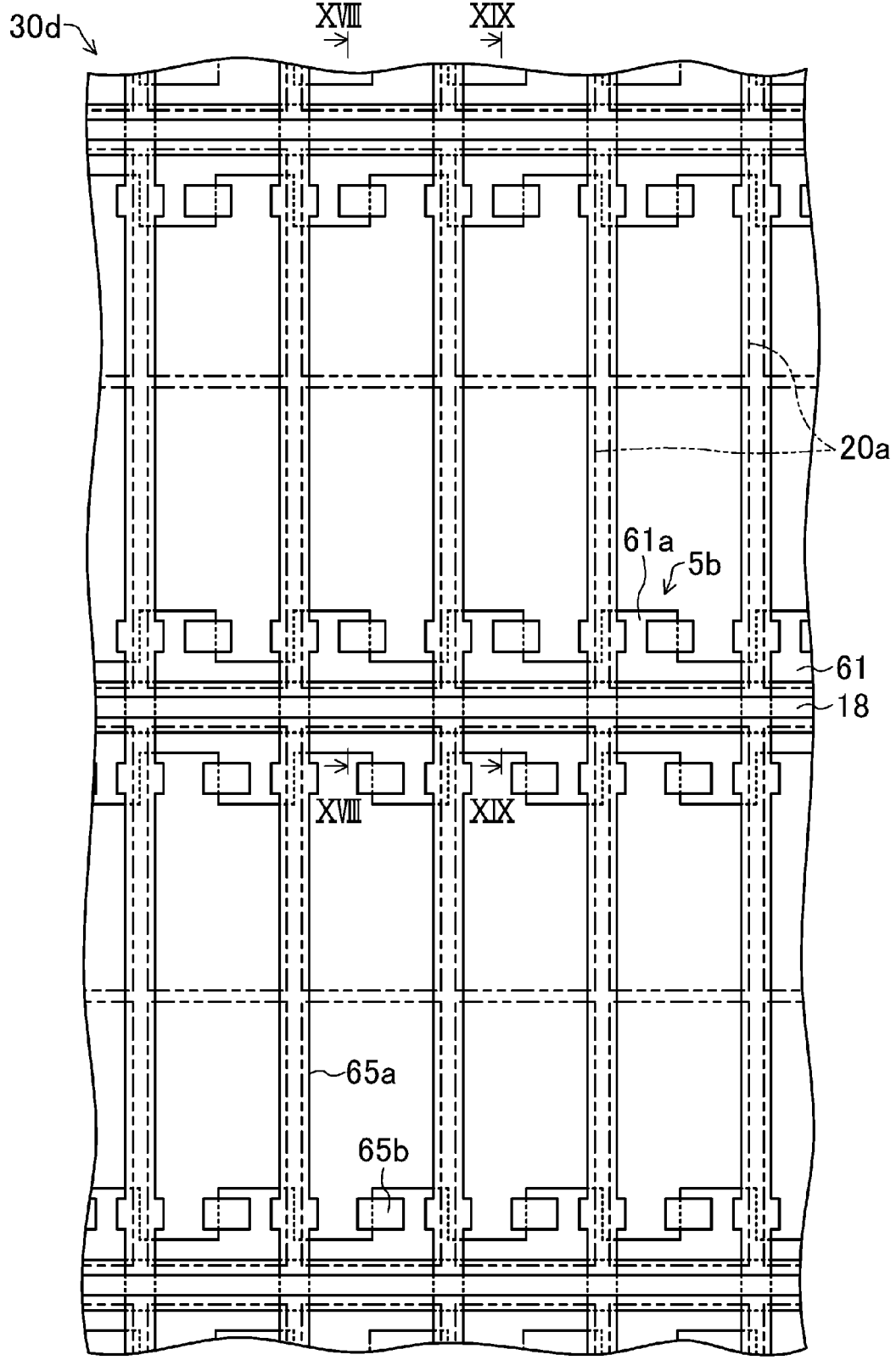
FIG. 15 is a plan view illustrating an active matrix substrate included in a liquid crystal display panel according to a fourth embodiment.
Figure 16:
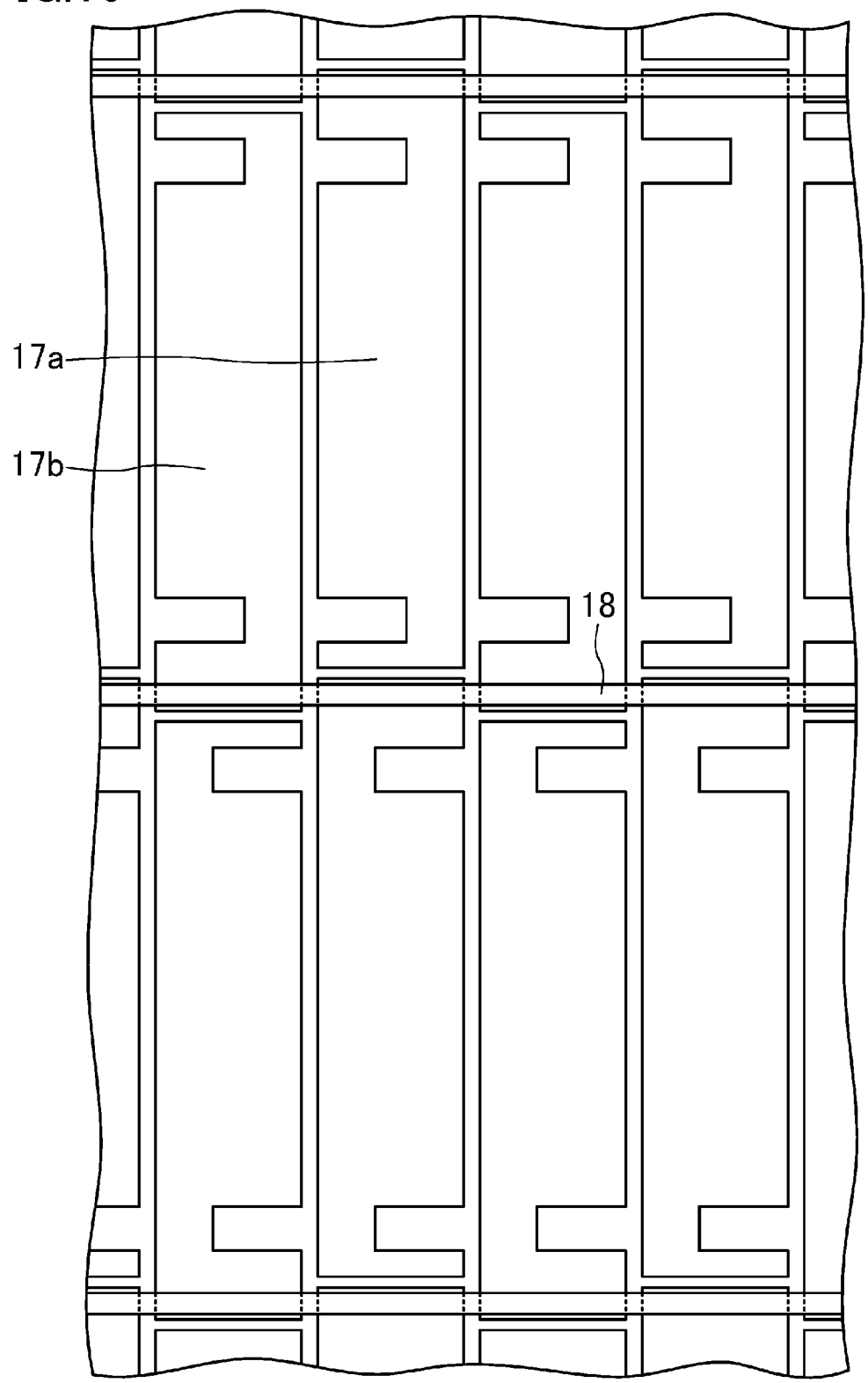
FIG. 16 is a plan view illustrating transparent electrodes and capacitor lines included in the active matrix substrate according to the fourth embodiment.
Figure 17:
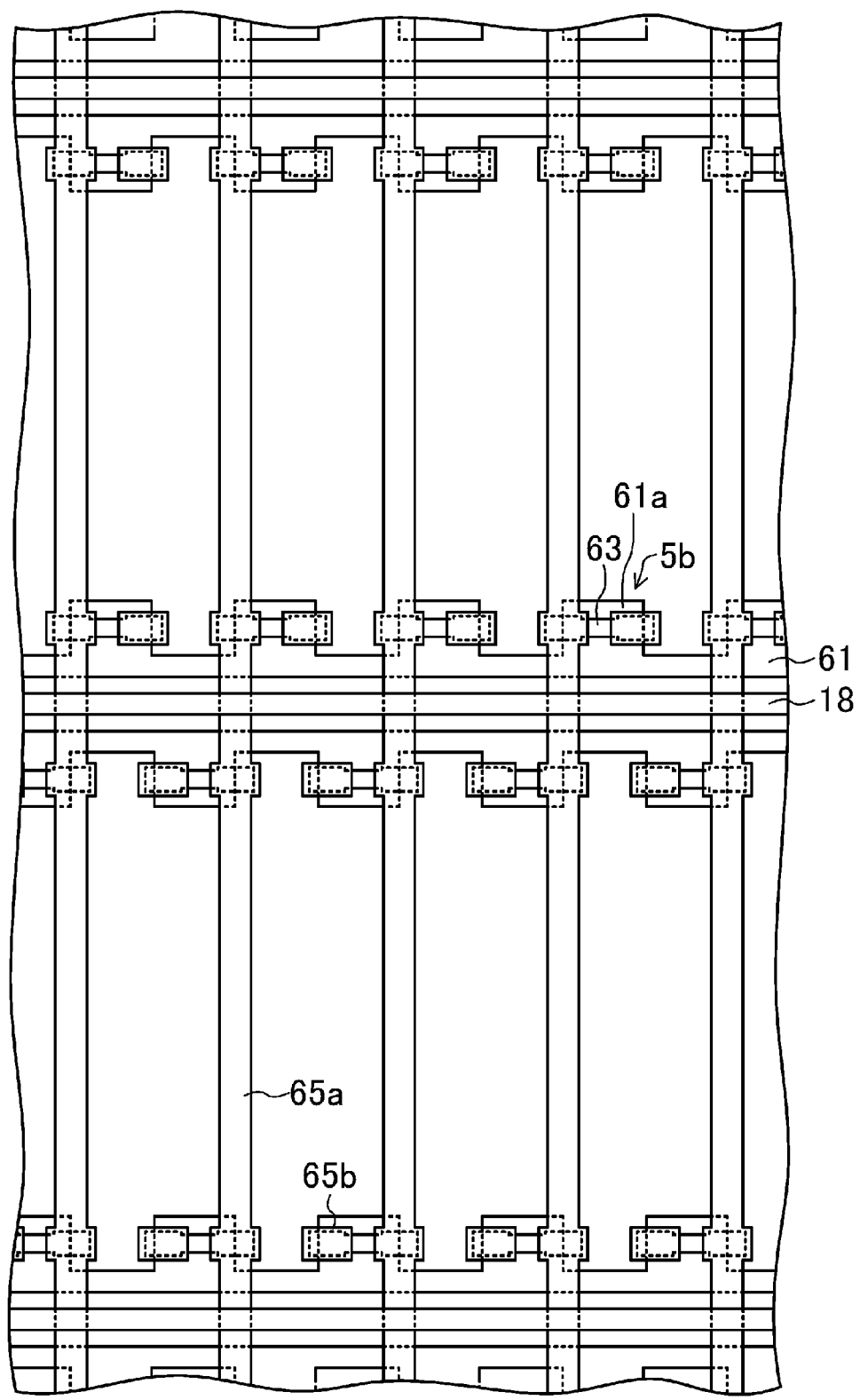
FIG. 17 is a plan view illustrating a semiconductor layer, a gate layer, and a source layer included in the active matrix substrate according to the fourth embodiment.
Figure 18:
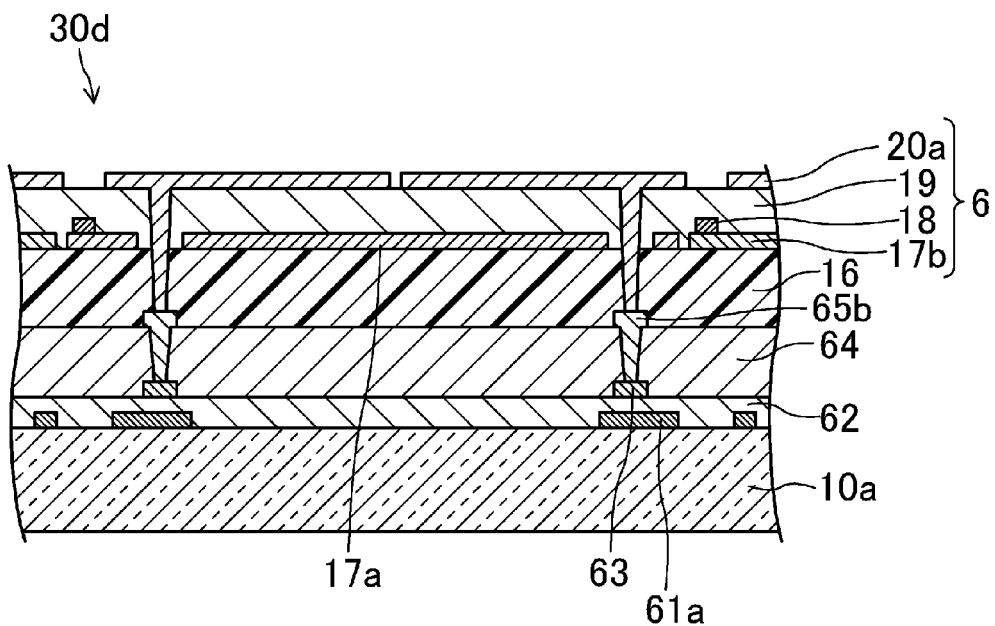
FIG. 18 is a cross-sectional view illustrating the active matrix substrate taken along the line XVIII-XVIII of FIG. 15.
Figure 19:
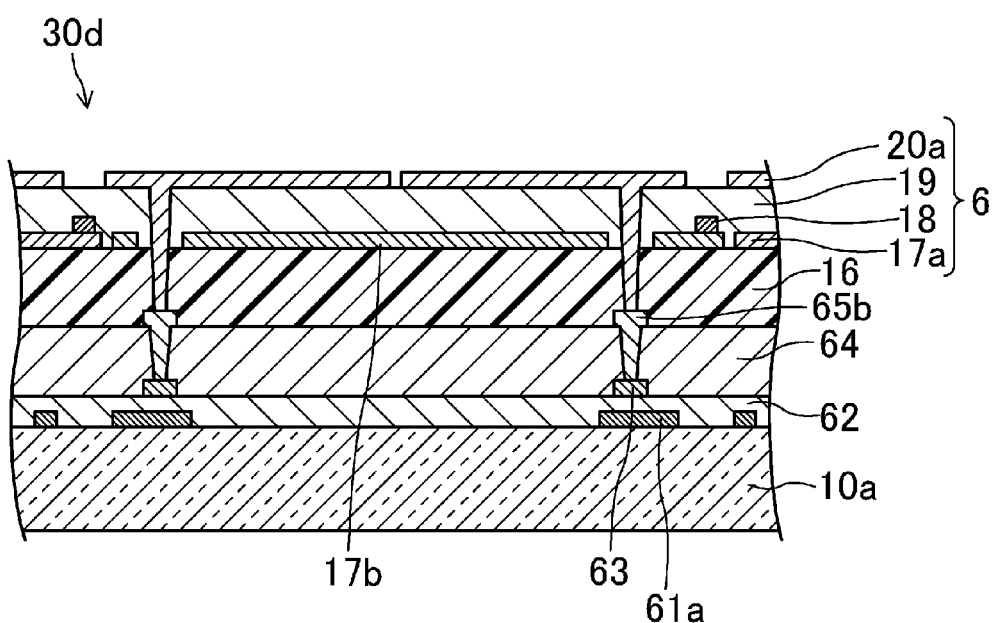
FIG. 19 is a cross-sectional view illustrating the active matrix substrate taken along the line XIX-XIX of FIG. 15.

FIGS. 15-19 show a fourth embodiment of an active matrix substrate of the present invention and a liquid crystal display panel including the same. Specifically, FIG. 15 is a plan view of an active matrix substrate 30d included in the liquid crystal display panel of the present embodiment. FIG. 16 is a plan view of transparent electrodes 17a and 17b and capacitor lines 18 included in the active matrix substrate 30d of FIG. 15. FIG. 17 is a plan view illustrating a semiconductor layer 63, a gate layer such as gate lines 61, a source layer such as source lines 65a included in the active matrix substrate 30d of FIG. 15. FIGS. 18 and 19 are sectional views illustrating the active matrix substrate 30d along the line XVIII-XVIII and XIX-XIX of FIG. 15, respectively. Here, in FIG. 15, pixel electrodes 20a located at an uppermost layer are indicated by a dash-double dotted line.

The first, second, and third embodiments have described the active matrix substrates 30a, 30b, and 30c including the TFTs 5a having a top gate structure, whereas the present embodiment will describe the active matrix substrate 30d including TFTs 5b having a bottom gate structure.

The liquid crystal display panel of the present embodiment includes the active matrix substrate 30d and a counter substrate 40 (see FIGS. 5 and 6) facing each other, a liquid crystal layer 35 (see FIGS. 5 and 6) provided between the active matrix substrate 30d and the counter substrate 40, and a frame-like sealing material (not shown) for bonding the active matrix substrate 30*d* and the counter substrate 40 to each other and for sealing the liquid crystal layer 35 between the active matrix substrate 30*d* and the counter substrate 40.

As illustrated in FIGS. 1-6, the active matrix substrate 30*d* includes transparent substrate 10*a*, the plurality of gate lines 61 each two of which are arranged in every other space extending in a row direction (a lateral direction in FIGS. 15-19) between the plurality of sub-pixels P on the transparent substrate 10*a* such that the gate lines 61 extend parallel to each other with narrow spaces and wide spaces being alternately provided therebetween, a gate insulating film 62 covering the gate lines 61, the plurality of source lines 65*a* each of which is provided on the gate insulating film 62 and is arranged in a corresponding one of spaces extending in a column direction (a longitudinal direction in FIGS. 15-19) between the sub-pixels P such that the source lines 65*a* extend parallel to each other, a plurality of TFTs 5*b* each provided as a switching element at a corresponding one of intersections of the gate lines 61 and the source lines 65*a*, a protective insulating film 16 covering the TFTs 5*b*, a plurality of transparent electrodes 17*a* and 17*b* provided in rows and columns on the protective insulating film 16, a capacitor insulating film 19 covering the transparent electrodes 17*a* and 17*b*, the plurality of pixel electrodes 20*a* provided in rows and columns on the capacitor insulating film 19, and each connected to a corresponding one of the TFTs 5*b*, and an alignment layer (not shown) covering the pixel electrodes 20*a*. Here, in the active matrix substrate 30*d*, as illustrated in FIGS. 15-19, an auxiliary capacitor 6 of each sub-pixel P includes the transparent electrode 17*a* or 17*b*, the pixel electrode 20*a*, and the capacitor insulating film 19 provided between the transparent electrode 17*a* or 17*b* and the pixel electrode 20*a*.

As illustrated in FIGS. 15-19, each TFT 5*b* includes a gate electrode 61*a* provided on the transparent substrate 10*a*, a gate insulating film 62 covering the gate electrode 61*a*, a semiconductor layer 63 provided on the gate insulating film 62 to overlap the gate electrode 61*a* in an island pattern, and a source electrode (65*a*) and a drain electrode 65*b* provided on semiconductor layer 63 to be spaced away from each other. Here, in the active matrix substrate 30*d*, as illustrated in FIGS. 15-19, the TFTs 5*b* are connected, for each pair of the sub-pixels P, to the source lines 65*a* different from each other, the sub-pixels P in the pair being adjacent to each other in the column direction and being arranged in a corresponding one of the wide spaces each provided between adjacent two of the gate lines 61 along the column direction.

As illustrated in FIGS. 15 and 17, each gate electrode 61*a* is a laterally extending portion of the gate line 61.

As illustrated in FIGS. 15 and 17, each source electrode (65*a*) is a portion of the source line 65*a* which is formed to have a large width.

As illustrated in FIGS. 18 and 19, each drain electrode 65*b* is connected to the pixel electrode 20*a* via a contact hole formed in the protective insulating film 16 and the capacitor insulating film 19.

As illustrated in FIGS. 15 and 16, each of the transparent electrodes 17*a* and 17*b* is shared by a pair of the sub-pixels P which are adjacent to each other in the column direction and are arranged in a corresponding one of the wide spaces between each adjacent two of the gate lines 61. As illustrated in FIG. 16, the transparent electrodes 17*a* and 17*b* are connected to the capacitor lines 18 different from each other such that the transparent electrodes 17*a* and 17*b* adjacent to each other in the row direction receive different signals. Here, as illustrated in FIGS. 15, 16, 18, and 19, on the transparent electrodes 17*a* and 17*b*, each capacitor line 18 is provided in a corresponding one of the narrow spaces each provided between adjacent two of the gate lines 61.

Next, the method for fabricating the active matrix substrate 30*d* of the present embodiment will be described.

First, on the entire transparent substrate 10*a* such as a glass substrate, a titanium film (having a thickness of about 30 nm), an aluminum film (having a thickness of about 100 nm), a titanium film (having a thickness of about 50 nm), and the like are sequentially formed by, for example, sputtering, thereby forming a metal multilayer film. Then, photolithography, etching, and resist removal and cleaning are performed with respect to the metal multilayer film, thereby forming gate lines 61 and gate electrodes 61*a*.

Subsequently, on the entire substrate on which the gate lines 61 and the gate electrodes 61*a* have been formed, a silicon oxide film or the like is formed by, for example, CVD to have a thickness of about 100 µm, thereby forming a gate insulating film 62.

Then, on the entire substrate on which the gate insulating film 62 has been formed, an In—Ga—Zn—O-based oxide semiconductor film (having a thickness of about 50 nm) is formed by, for example, sputtering. Then, photolithography, etching and resist removal and cleaning are performed with respect to the oxide semiconductor film, thereby forming a semiconductor layer 63. Although an In—Ga—Zn—O-based oxide semiconductor has been described in the present embodiment as an example of the semiconductor layer 63, the semiconductor layer 63 may be made of amorphous silicon, or the like.

Further, on the entire substrate on which the semiconductor layer 63 has been formed, an inorganic insulating film such as a silicon nitride film, a silicon oxide film, a multilayer film of such films, or the like is formed by, for example, CVD to have a thickness of about 700 nm. Then, photolithography, etching, and resist removal and cleaning are performed with respect to the inorganic insulating film, thereby forming an interlayer insulating film 64.

Subsequently, on the entire substrate on which the interlayer insulating film 64 has been formed, a titanium film (having a thickness of about 30 nm), an aluminum film (having a thickness of about 100 nm), a titanium film (having a thickness of about 50 nm), and the like are sequentially formed by, for example, sputtering, thereby forming a metal multilayer film. Then, photolithography, etching, and resist removal and cleaning are performed with respect to the metal multilayer film to form source lines 65*a* including source electrodes (65*a*) and drain electrodes 65*b* are formed, thereby forming TFTs 5*b*.

Further, on the entire substrate on which the TFTs 5*b* have been formed, acrylic photosensitive resin is applied by, for example, spin coating or slit coating to have a thickness of about 2 µm, thereby forming a coating film. Then, the coating film is exposed, developed, and baked, thereby forming a protective insulating film 16.

Subsequently, steps after the formation of the protective insulating film 16 in the active matrix substrate fabrication step of the first embodiment are performed, thereby forming the active matrix substrate 30*d*.

As described above, in the active matrix substrate 30*d* of the present embodiment and the liquid crystal display panel including the same, similar to the first embodiment, the auxiliary capacitor 6 of each sub-pixel P includes the transparent electrode 17*a* or 17*b*, the pixel electrode 20*a*, and the capacitor insulating film 19 provided between the transparent electrode 17*a* or 17*b* and the pixel electrode 20*a*, the TFTs 5*b* are connected, for each pair of the sub-pixels P, to the source lines 65*a* different from each other, the sub-pixels P in the pair being adjacent to each other in the column direction and being arranged in a corresponding one of the wide spaces between each adjacent two of the gate lines 61 along the column direction of the sub-pixels P arranged in rows and columns, and each of the transparent electrodes 17a and 17b is shared by a pair of the sub-pixels P which are adjacent to each other in the column direction and are arranged in a corresponding one of the wide spaces between each adjacent two of the gate lines 61, wherein the transparent electrodes adjacent to each other in the row direction receive different signals. Thus, the aperture ratio of each sub-pixel P can be improved, degradation in image quality can be reduced, and the panel driving power can be reduced.

Although a TFT has been described as an example of a switching element in the above embodiments, the present invention is applicable to other switching elements such as metal oxide semiconductor field effect transistors (MOSFETs).

Although an active matrix substrate in which an electrode of the TFT connected to the pixel electrode is the drain electrode has been described as an example in the above embodiments, the present invention is applicable to an active matrix substrate in which an electrode of the TFT connected to the pixel electrode is referred to as a source electrode.

INDUSTRIAL APPLICABILITY

As described above, the present invention can improve the aperture ratio of the sub-pixel, reduce degradation in image quality, reduce the panel driving power, and thus is useful for active matrix drive liquid crystal display panels.

DESCRIPTION OF REFERENCE CHARACTERS

P Sub-pixel
5a, 5b TFT (Switching Element)
13, 61 Gate Line
15a, 65a Source Line
16 Protective Insulating Film
17a-17f Transparent Electrode
18 Capacitor Line
19 Capacitor Insulating Film
20a, 20b Pixel Electrode
30a-30d Active Matrix Substrate
35 Liquid Crystal Layer
40 Counter Substrate
50a, 50b Liquid Crystal Display Panel

The invention claimed is:

1. An active matrix substrate comprising:
a plurality of sub-pixels arranged in rows and columns;
a plurality of gate lines each two of which are arranged in every other space extending in a row direction between the sub-pixels such that the gate lines extend parallel to each other with narrow spaces and wide spaces being alternately provided therebetween;
a plurality of source lines each of which is provided in a corresponding one of spaces extending in a column direction between the sub-pixels such that the source lines extend parallel to each other;
a plurality of switching elements
each of which is provided at a corresponding one of intersections of the gate lines and the source lines, and which are connected, for each pair of the sub-pixels, to the source lines different from each other, the sub-pixels in the pair being adjacent to each other in the column direction and being arranged in a corresponding one of the wide spaces each provided between adjacent two of the gate lines along the column direction;
a protective insulating film covering the switching elements,
a plurality of transparent electrodes provided on the protective insulating film such that each transparent electrode is shared by a pair of the sub-pixels which are adjacent to each other in the column direction and are arranged in a corresponding one of the wide spaces each provided between adjacent two of the gate lines, wherein the transparent electrodes adjacent to each other in the row direction receive different signals;
a capacitor insulating film covering the transparent electrodes, and
a plurality of pixel electrodes arranged in rows and columns on the capacitor insulating film and each connected to a corresponding one of the switching elements.

2. An active matrix substrate of claim 1, further comprising:
capacitor lines each provided in corresponding one of the narrow spaces each provided between adjacent two of the gate lines, wherein
the transparent electrodes, each of which is shared by the pair of sub-pixels and which are adjacent to each other in the row direction, are connected to the capacitor lines different from each other.

3. The active matrix substrate of claim 2, wherein each capacitor line is in contact with corresponding ones of the transparent electrodes.

4. The active matrix substrate of claim 2, wherein the capacitor lines are fewer than the gate lines.

5. The active matrix substrate of claim 2, wherein $y=x/2+1$ where y represents a quantity of the capacitor lines, x represents a quantity of the gate lines, and x is an even number.

6. The active matrix substrate of claim 2, wherein $y=x/2+1.5$ where y represents a quantity of the capacitor lines, x represents a quantity of the gate lines, and x is an odd number.

7. A liquid crystal display panel comprising:
the active matrix substrate of claim 2;
a counter substrate facing the active matrix substrate; and
a liquid crystal layer between the active matrix substrate and the counter substrate, wherein
the liquid crystal display panel is configured such that signals input to the source lines have different polarities for every other line, and the polarities are unchanged within one vertical period.

8. The liquid crystal display panel of claim 7, wherein each capacitor receives a voltage having a high electric potential or a voltage having a low electric potential with a reception timing being shifted by two horizontal periods sequentially in an order of arrangement of the capacitor lines such that the capacitor lines receiving the voltage having the high electric potential and the capacitor lines receiving the voltage having the low electric potential are alternately arranged.

9. The active matrix substrate of claim 1, wherein each switching element is a thin film transistor.

10. The active matrix substrate of claim 9, wherein the thin film transistor has a top gate structure.

11. The active matrix substrate of claim 9, wherein the thin film transistor has a bottom gate structure.

12. A liquid crystal display panel, comprising:
the active matrix substrate of claim 1;
a counter substrate facing the active matrix substrate; and
a liquid crystal layer between the active matrix substrate and the counter substrate.

13. An active matrix substrate comprising:
a plurality of sub-pixels arranged in rows and columns;
a plurality of gate lines each two of which are arranged in every other space extending in a row direction between the sub-pixels such that the gate lines extend parallel to each other with narrow spaces and wide spaces being alternately provided therebetween;
a plurality of source lines each of which is provided in a corresponding one of spaces extending in a column direction between the sub-pixels such that the source lines extend parallel to each other;
a plurality of switching elements
each of which is provided at a corresponding one of intersections of the gate lines and the source lines, and which are connected, for each sub-pixel along the column direction, to the source lines different from each other;
a protective insulating film covering the switching elements;
a plurality of transparent electrodes provided on the protective insulating film such that each transparent electrode is shared by a pair of the sub-pixels which are adjacent to each other in a diagonal direction of the sub-pixels and are arranged in a corresponding one of the wide spaces each provided between adjacent two of the gate lines, wherein the transparent electrodes adjacent to each other in the row direction receive different signals;
a capacitor insulating film covering the transparent electrodes; and
a plurality of pixel electrodes arranged in rows and columns on the capacitor insulating film and each connected to a corresponding one of the switching elements.

14. An active matrix substrate of claim 13, further comprising:
capacitor lines each provided in corresponding one of the narrow spaces each provided between adjacent two of the gate lines, wherein
the transparent electrodes, each of which is shared by the pair of sub-pixels and which are adjacent to each other in the row direction, are connected to the capacitor lines different from each other.

15. The active matrix substrate of claim 14, wherein
each capacitor line is in contact with corresponding ones of the transparent electrodes.

16. A liquid crystal display panel comprising:
the active matrix substrate of claim 14;
a counter substrate facing the active matrix substrate; and
a liquid crystal layer between the active matrix substrate and the counter substrate, wherein
the liquid crystal display panel is configured such that signals input to the source lines have different polarities for every other line, and the polarities are unchanged within one vertical period.

17. The active matrix substrate of claim 13, wherein
each switching element is a thin film transistor.

18. The active matrix substrate of claim 17, wherein
the thin film transistor has a top gate structure.

19. The active matrix substrate of claim 17, wherein
the thin film transistor has a bottom gate structure.

20. A liquid crystal display panel, comprising:
the active matrix substrate of claim 13;
a counter substrate facing the active matrix substrate; and
a liquid crystal layer between the active matrix substrate and the counter substrate.

* * * * *